(12) United States Patent
Shimura et al.

(10) Patent No.: US 9,240,416 B2
(45) Date of Patent: Jan. 19, 2016

(54) SEMICONDUCTOR MEMORY DEVICE

(71) Applicant: Kabushiki Kaisha Toshiba, Minato-ku (JP)

(72) Inventors: Yasuhiro Shimura, Yokkaichi (JP);
Masaaki Higuchi, Yokkaichi (JP);
Hirokazu Ishigaki, Yokkaichi (JP);
Tatsuya Okamoto, Inabe (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/487,359

(22) Filed: Sep. 16, 2014

(65) Prior Publication Data
US 2015/0364485 A1 Dec. 17, 2015

Related U.S. Application Data

(60) Provisional application No. 62/011,421, filed on Jun. 12, 2014.

(51) Int. Cl.
*H01L 29/788* (2006.01)
*H01L 27/115* (2006.01)
*H01L 29/49* (2006.01)
*H01L 29/51* (2006.01)
*H01L 29/423* (2006.01)

(52) U.S. Cl.
CPC .... *H01L 27/11556* (2013.01); *H01L 27/11582* (2013.01); *H01L 29/4234* (2013.01); *H01L 29/42324* (2013.01); *H01L 29/495* (2013.01); *H01L 29/4916* (2013.01); *H01L 29/4966* (2013.01); *H01L 29/513* (2013.01); *H01L 29/518* (2013.01)

(58) Field of Classification Search
USPC .................................. 257/314–326, E27.078,
257/E29.3–E29.309, E21.179–E21.182,
257/E21.209, E21.21, E21.422, E21.423,
257/E21.679–E21.694, E21.646–E21.66,
257/68–71, 296–309, 905–908,
257/E27.084–E27.097, E27.075;
365/185.11, 185.05, 185.18, 185.19,
365/185.28, 185.29, 189.011, 51; 438/73,
438/104
See application file for complete search history.

(56) References Cited

U.S. PATENT DOCUMENTS

| 8,309,405 | B2 | 11/2012 | Yang et al. | |
| 8,344,385 | B2 | 1/2013 | Kim et al. | |
| 2011/0188321 | A1* | 8/2011 | Kito | H01L 29/792 365/185.29 |
| 2012/0098050 | A1* | 4/2012 | Shim | H01L 29/7926 257/324 |
| 2014/0061751 | A1* | 3/2014 | Nakajima | H01L 27/088 257/314 |

(Continued)

*Primary Examiner* — Dao H Nguyen
*Assistant Examiner* — Tram H Nguyen
(74) *Attorney, Agent, or Firm* — Oblon, McClelland, Maier & Neustadt, L.L.P.

(57) ABSTRACT

A semiconductor memory device according to an embodiment includes a stacked body with electrode films and inter-electrode insulating films alternately stacked therein, a semiconductor member, a charge accumulation film, an insulating member and a floating electrode member. The semiconductor member is provided in the stacked body. The insulating member is provided at a position opposed to the inter-electrode insulating film on a side surface of the charge accumulation film. The insulating member is divided for each of the inter-electrode insulating films. The floating electrode member is provided on a region of the side surface of the charge accumulation film not covered with the insulating member. The floating electrode member is in contact with the charge accumulation film. The floating electrode member is divided for each of the electrode films. The floating electrode member has higher conductivity than the charge accumulation film.

17 Claims, 17 Drawing Sheets

(56) References Cited

U.S. PATENT DOCUMENTS

2014/0264532 A1* 9/2014 Dennison .......... H01L 27/11578 257/316

2015/0076579 A1* 3/2015 Tsuji .................. H01L 29/7926 257/314

* cited by examiner

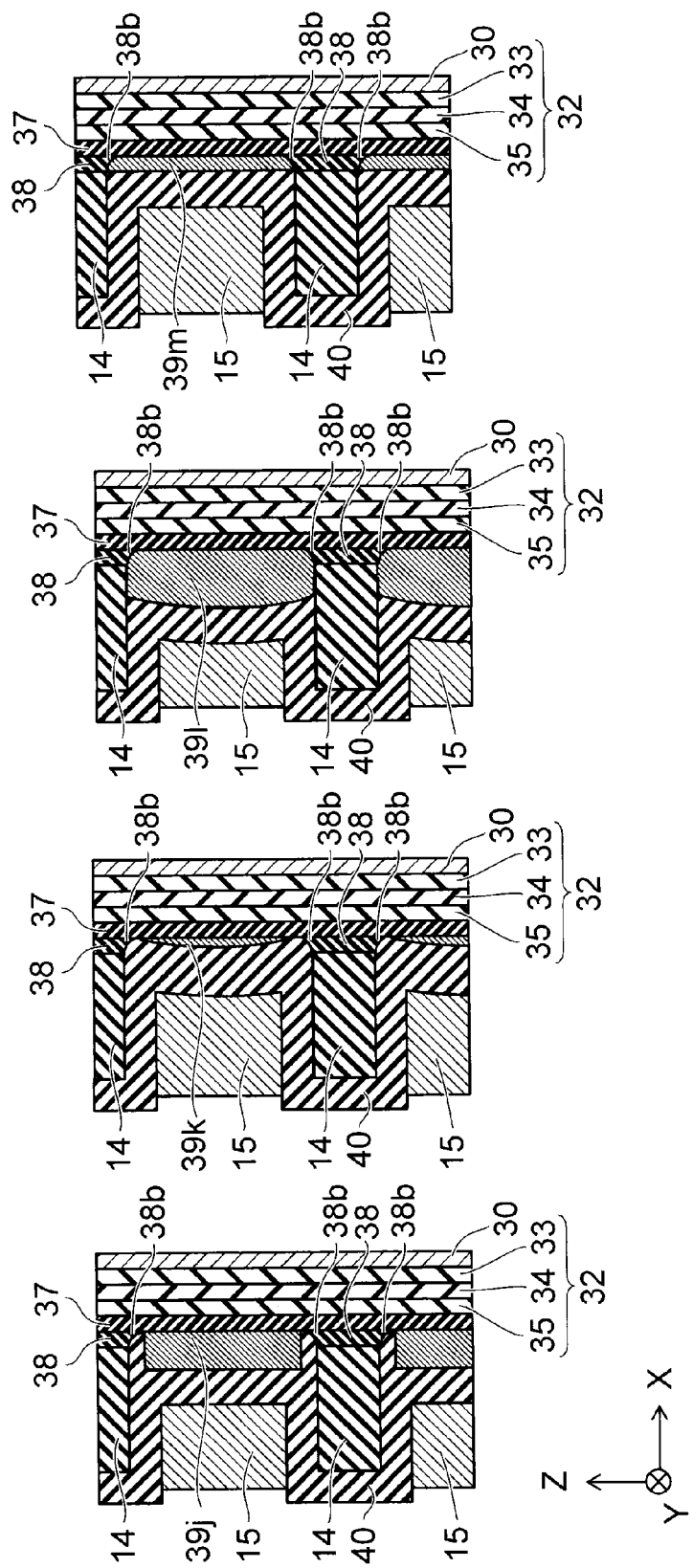

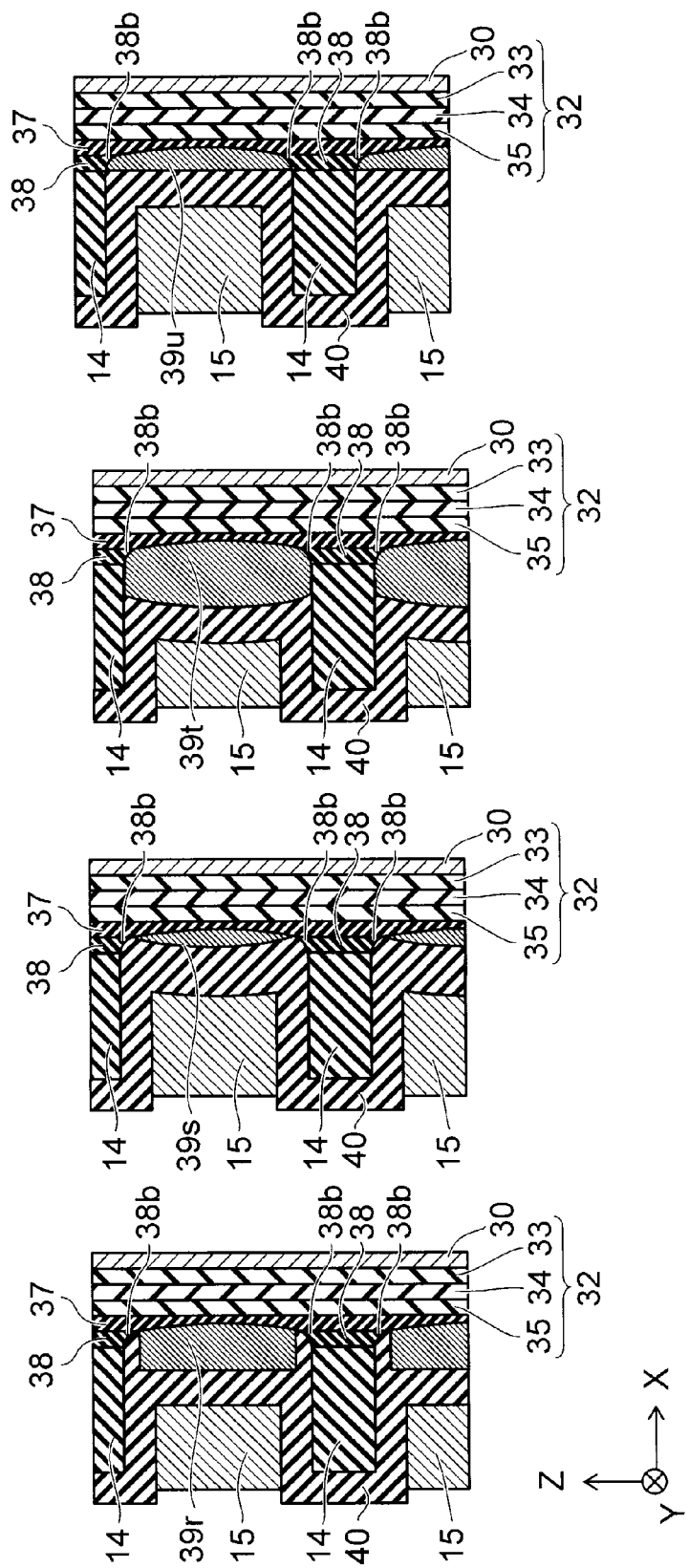

SEMICONDUCTOR MEMORY DEVICE

CROSS-REFERENCE TO RELATED APPLICATIONS

This application is based upon and claims the benefit of priority from U.S. Provisional Patent Application 62/011,421, filed on Jun. 12, 2014; the entire contents of which are incorporated herein by reference.

FIELD

Embodiments described herein relate generally to a semiconductor memory device.

BACKGROUND

A stacked semiconductor memory device with memory cells arranged in three dimensions has recently been proposed in order to increase the memory density beyond the limit of lithography technique. In such a stacked semiconductor memory device, improvement in data retention characteristics is desired.

BRIEF DESCRIPTION OF THE DRAWINGS

FIGS. 3A to 4D are process sectional views showing a method for manufacturing a semiconductor memory device according to the first embodiment;

FIGS. 5A to 6D are sectional views showing vicinities of floating electrode members of semiconductor memory devices according to variations of the first embodiment;

FIGS. 8A to 11C are sectional views showing vicinities of floating electrode members of semiconductor memory devices according to variations of the second embodiment;

DETAILED DESCRIPTION

A semiconductor memory device according to an embodiment includes a stacked body with electrode films and inter-electrode insulating films alternately stacked therein, a semiconductor member, a first insulating film, a charge accumulation film, an insulating member, a floating electrode member and a second insulating film. The semiconductor member is provided in the stacked body and extends in stacking direction of the electrode films and the inter-electrode insulating films. The first insulating film is provided on a side surface of the semiconductor member. The charge accumulation film is provided on a side surface of the first insulating film. The insulating member is provided at a position opposed to the inter-electrode insulating film on a side surface of the charge accumulation film. The insulating member is divided for each of the inter-electrode insulating films along the stacking direction. The insulating member is made of a material different from that of the charge accumulation film. The floating electrode member is provided on a region of the side surface of the charge accumulation film not covered with the insulating member. The floating electrode member is in contact with the charge accumulation film. The floating electrode member is divided for each of the electrode films along the stacking direction. The floating electrode member has higher conductivity than the charge accumulation film. The second insulating film is provided between the floating electrode member and the electrode film.

Embodiments of the invention will now be described with reference to the drawings.

First Embodiment

First, a first embodiment is described.

Figure 1:
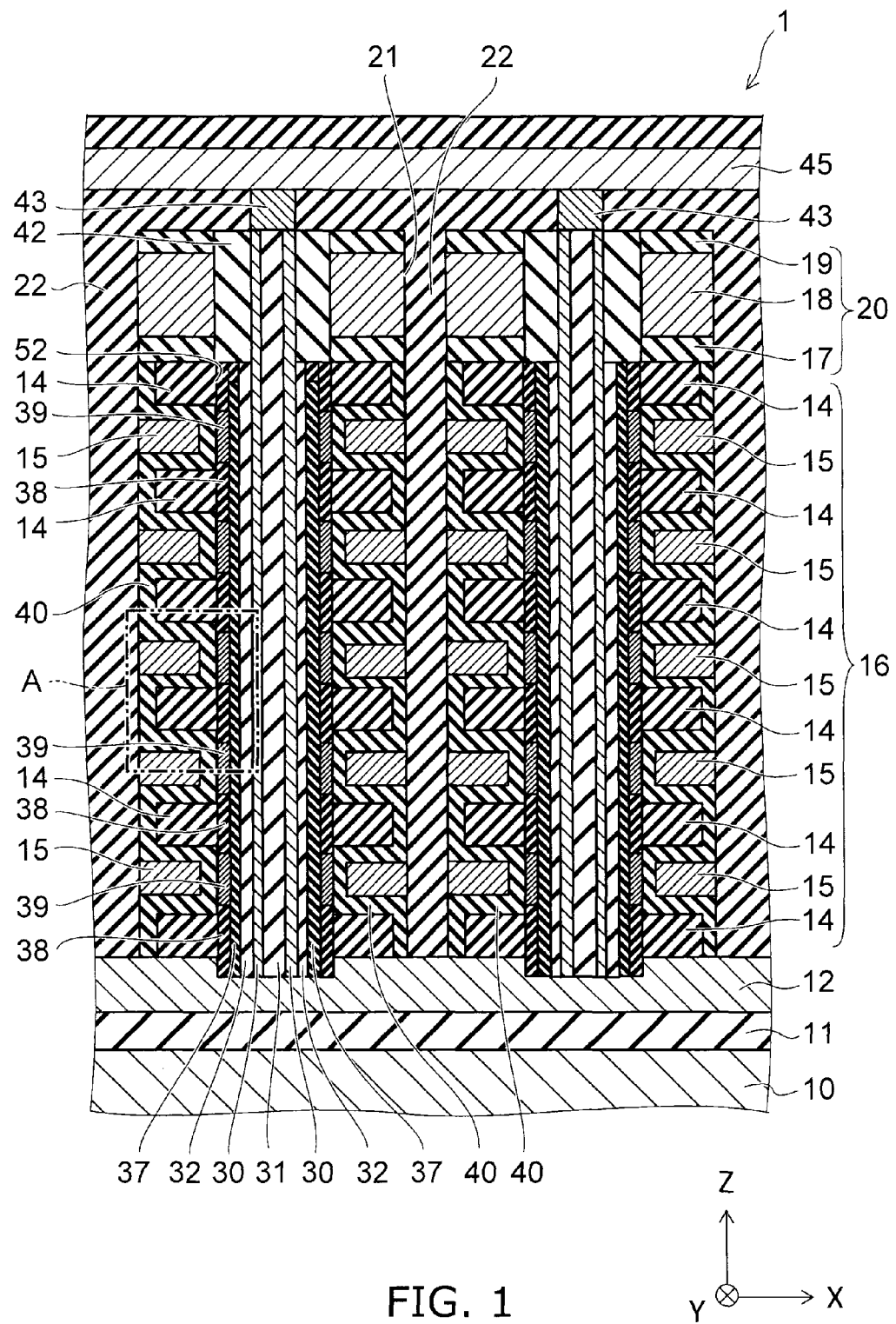
FIG. 1 is a sectional view showing a semiconductor memory device according to a first embodiment.

FIG. 1 is a sectional view showing a semiconductor memory device according to the embodiment.

Figure 2:
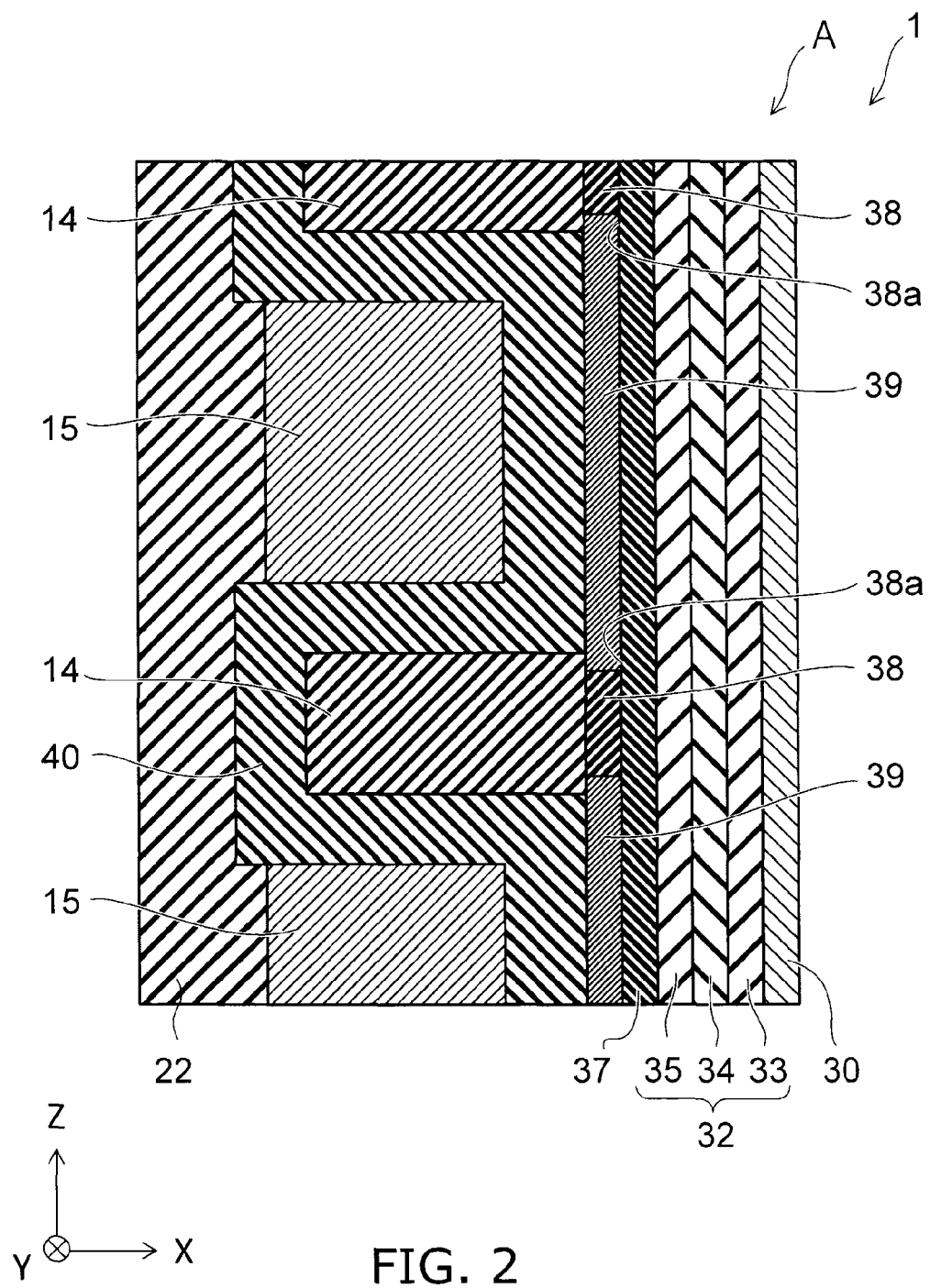
FIG. 2 is a sectional view showing region A of FIG. 1.
Figure 3:
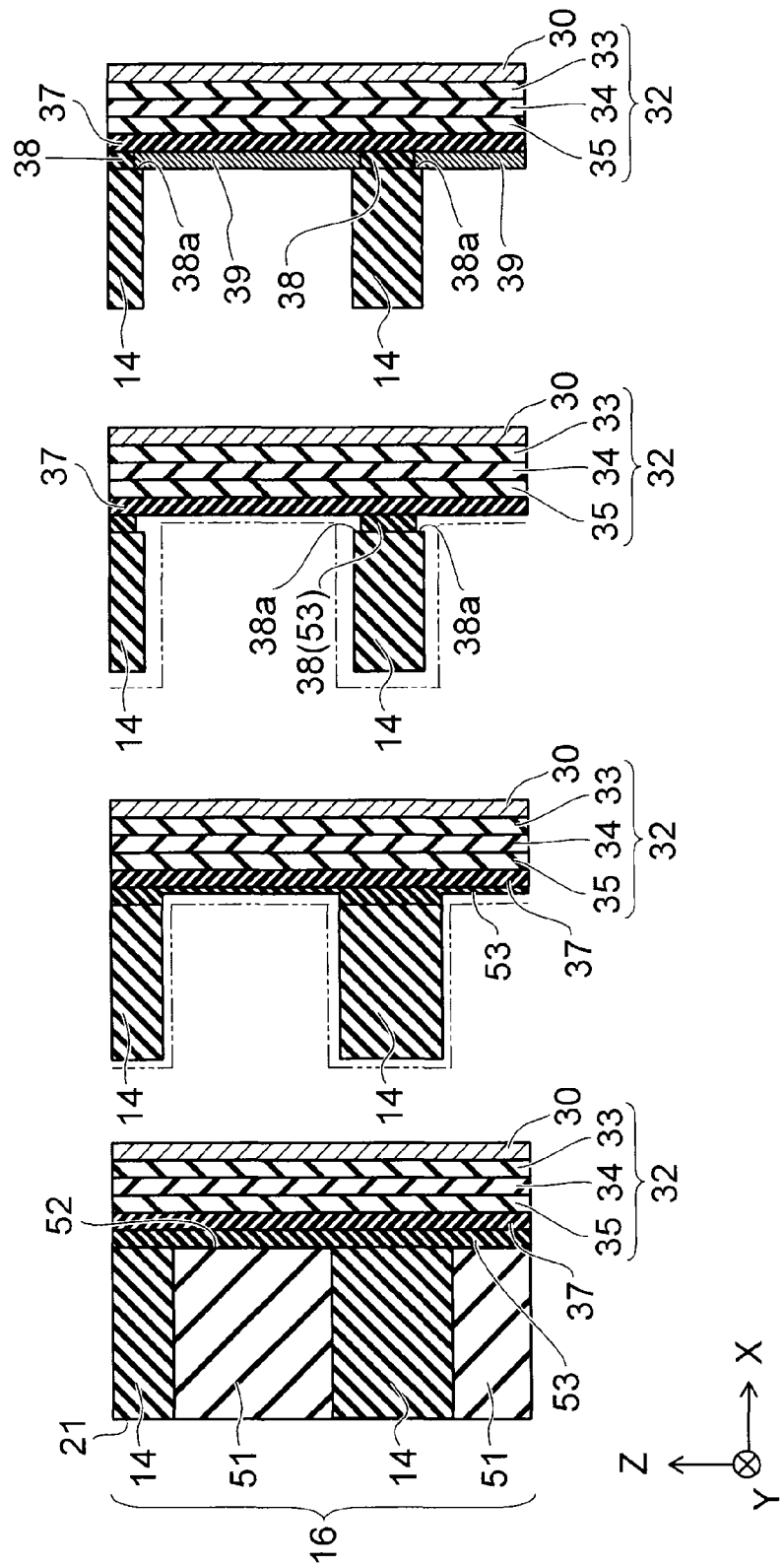
Figure 4:
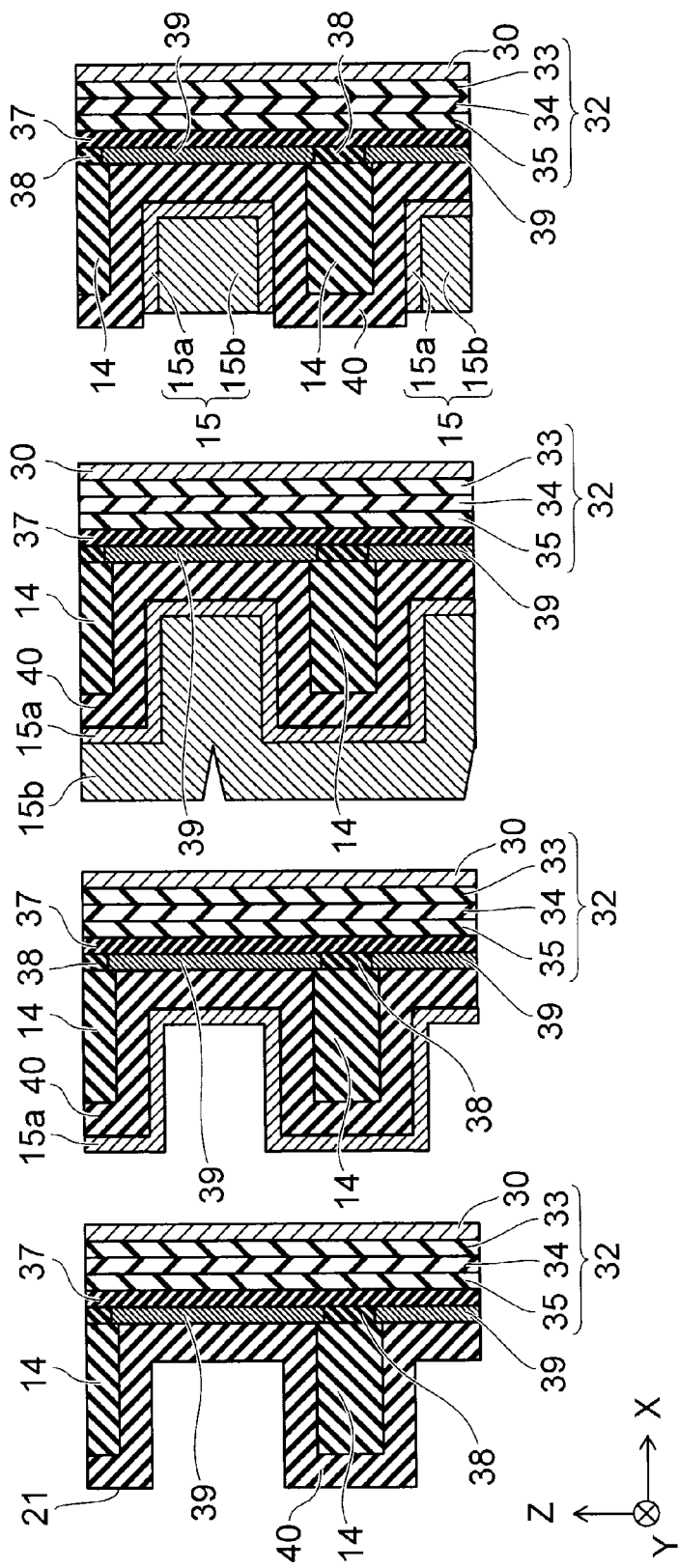

FIG. 2 is a sectional view showing region A of FIG. 1.

As shown in FIG. 1, the semiconductor memory device 1 according to the embodiment includes a silicon substrate 10. An interlayer insulating film 11 and a source electrode film 12 are stacked thereon in this order. The interlayer insulating film 11 is formed from e.g. silicon oxide. The source electrode film 12 is formed from e.g. polysilicon containing impurity.

For convenience of description, an XYZ orthogonal coordinate system is adopted in this specification. Two directions parallel to the upper surface of the silicon substrate 10 and orthogonal to each other are referred to as "X-direction" and "Y-direction". The direction perpendicular to the upper surface of the silicon substrate 10 is referred to as "Z-direction".

A plurality of silicon oxide films 14 and gate electrode films 15 are alternately stacked on the source electrode film 12 and constitute a stacked body 16. The gate electrode film 15 is formed from a conductive material such as tungsten (W). The silicon oxide film 14 is formed from silicon oxide. The silicon oxide film 14 is an inter-electrode insulating film for insulation between the gate electrode films 15. An upper stacked body 20 with an interlayer insulating film 17, a select gate electrode film 18, and an interlayer insulating film 19 stacked in this order is provided on the stacked body 16.

A slit 21 extending in the Y-direction is formed in the stacked body 16 and the upper stacked body 20. An insulating member 22 is embedded in the slit 21. The insulating member 22 is formed from e.g. silicon oxide. This divides the silicon oxide films 14 and the gate electrode films 15 into strip-shaped portions extending in the Y-direction.

Furthermore, a plurality of silicon pillars 30 extending in the Z-direction are provided inside the stacked body 16 and the upper stacked body 20 so as to penetrate therethrough. The plurality of silicon pillars 30 are arranged in a matrix along the X-direction and the Y-direction. Each silicon pillar 30 penetrates through the strip-shaped portions of the stacked body 16 and the upper stacked body 20 defined by the slit 21. Each silicon pillar 30 is shaped like e.g. a circular cylinder, and a silicon oxide member 31 is provided therein. The lower end part of the silicon pillar 30 is connected to the source electrode film 12. Alternatively, the silicon pillar 30 may be shaped like a circular column without including a silicon oxide member 31. The arrangement of the plurality of silicon pillars 30 is not limited to a matrix, but may be e.g. a staggered configuration. In the stacked body 16, a tunnel insulating film 32 is provided on the outer side surface of the silicon pillar 30. The tunnel insulating film 32 is a film that is normally insulating, but passing a tunnel current when applied with a prescribed voltage within the range of the driving voltage of the semiconductor memory device 1.

As shown in FIG. 2, the tunnel insulating film 32 is e.g. an ONO (oxide-nitride-oxide) film. That is, in the tunnel insulating film 32, a silicon oxide layer 33, a silicon nitride layer 34, and a silicon oxide layer 35 are formed sequentially from the silicon pillar 30 side.

A silicon nitride film 37 is provided on the outer side surface of the tunnel insulating film 32. The silicon nitride film 37 is a charge accumulation film for accumulating charge, and is made of e.g. silicon nitride. Silicon oxide members 38 and floating electrode members 39 are provided alternately and intermittently in the Z-direction on the outer side surface of the silicon nitride film 37. In the direction orthogonal to the Z-direction, the thickness of the floating electrode member 39 is nearly equal to the thickness of the silicon oxide member 38. Here, the floating electrode member 39 is a member not connected to the silicon pillar 30 and the gate electrode film 15, but allowing a tunnel current to flow from/to the silicon pillar 30 when applied with a certain voltage. Thus, the floating electrode member 39 is placed in an electrically floating state.

The silicon oxide member 38 is an insulating member made of a material different from the silicon nitride film 37, such as silicon oxide. The silicon oxide member 38 is placed at a position opposed to the silicon oxide film 14. The floating electrode member 39 is placed on the region of the silicon nitride film 37 not covered with the silicon oxide member 38, i.e., at a position opposed to the gate electrode film 15. The floating electrode member 39 is in contact with the silicon nitride film 37.

In the Z-direction, the length of the silicon oxide member 38 is shorter than the length of the silicon oxide film 14. Thus, the upper end surface and the lower end surface of the silicon oxide member 38 are set back from the upper surface and the lower surface of the silicon oxide film 14. Thus, a recess 38a is formed. The upper end part and the lower end part of the floating electrode member 39 extend into the recess 38a.

The floating electrode member 39 is formed from a material having higher conductivity than the silicon nitride film 37. For instance, the floating electrode member 39 is formed from a conductive material. The floating electrode member 39 includes one or more materials selected from the group consisting of e.g. silicon, metal, metal oxide, and metal nitride. For instance, the floating electrode member 39 includes one or more materials selected from the group consisting of silicon (Si), tungsten (W), ruthenium (Ru), platinum (Pt), tantalum (Ta), tantalum oxide (TaO), ruthenium oxide (RuO), tantalum nitride (TaN), tungsten nitride (WN), and silicon nitride (SiN).

In the case where the floating electrode member 39 is made of silicon nitride, this silicon nitride has higher silicon concentration and higher conductivity than the silicon nitride forming the silicon nitride film 37. In the case where the floating electrode member 39 is made of polysilicon, this polysilicon may be non-doped polysilicon not actively doped with impurity, may be doped with a single impurity of e.g. phosphorus (P), boron (B), carbon (C), or nitrogen (N), or doped with a combination of these impurities.

A block insulating film 40 is provided between the floating electrode member 39 and the gate electrode film 15. The block insulating film 40 is a film not substantially passing a current even when applied with a voltage within the range of the driving voltage of the semiconductor memory device 1. For instance, the block insulating film 40 is formed from silicon oxide, aluminum oxide, or hafnium oxide. In the embodiment, the block insulating film 40 is a two-layer film in which a silicon oxide film and an aluminum oxide film are stacked. The block insulating film 40 is placed also between the silicon oxide film 14 and the gate electrode film 15 and between the silicon oxide film 14 and the insulating member 22. Thus, the block insulating film 40 is shaped like a circular cylinder continuously extending in the Z-direction and having a diameter periodically changing in the Z-direction, i.e., shaped like an accordion.

On the other hand, in the upper stacked body 20, a gate insulating film 24 is provided on the side surface of the silicon pillar 30. A plug 43 made of e.g. tungsten is provided on the silicon pillar 30. A bit line 45 extending in the X-direction is provided on the plug 43. Thus, the upper end part of the silicon pillar 30 is connected to the bit line 45 through the plug 43.

Next, a method for manufacturing a semiconductor memory device according to the embodiment is described.

FIGS. 3A to 4D are process sectional views showing the method for manufacturing a semiconductor memory device according to the embodiment. FIGS. 3A to 4D show a portion corresponding to region A of FIG. 1.

First, as shown in FIGS. 1 and 3A, an interlayer insulating film 11 and a source electrode film 12 are formed on a silicon substrate 10. Next, silicon oxide films 14 and silicon nitride films 51 are alternately formed to form a stacked body 16.

Next, by lithography technique and RIE (reactive ion etching) technique, the stacked body 16 is selectively removed to form a memory hole 52 reaching the source electrode film 12. Next, for instance, by depositing silicon oxide by CVD (chemical vapor deposition) technique, a cover silicon oxide film 53 is formed on the inner surface of the memory hole 52. Next, by depositing silicon nitride, a silicon nitride film 37 is formed on the side surface of the cover silicon oxide film 53. Next, a silicon oxide layer 35, a silicon nitride layer 34, and a silicon oxide layer 33 are formed in this order on the side surface of the silicon nitride film 37 to form a tunnel insulating film 32. Next, by depositing silicon, a silicon pillar 30 shaped like a circular cylinder is formed on the side surface of the tunnel insulating film 32. Next, by depositing silicon oxide, a silicon oxide member 31 is embedded inside the silicon pillar 30.

Next, the stacked body 16 is selectively removed by RIE technique. Thus, a slit 21 extending in the Y-direction is formed in the portion between the memory holes 52.

Next, as shown in FIG. 3B, wet etching with DHF (diluted hydrofluoric acid) is performed through the slit 21 to set back the surface of the silicon oxide film 14 exposed in the slit 21 (not shown).

Next, wet etching with phosphoric acid ($H_3PO_4$) is performed through the slit 21 to remove the silicon nitride film 51. As a result, part of the cover silicon oxide film 53 is exposed in the slit 21. At this time, the exposed surface of the silicon oxide film 14 and the cover silicon oxide film 53 is also slightly etched.

Next, as shown in FIG. 3C, wet etching with DHF is performed on the cover silicon oxide film 53 to remove the portion of the cover silicon oxide film 53 not covered with the silicon oxide film 14. Thus, the silicon nitride film 37 is exposed. At this time, part of the outer peripheral portion of the silicon oxide film 14 is also removed. On the other hand, the portion of the cover silicon oxide film 53 covered with the silicon oxide film 14 remains and constitutes a silicon oxide member 38. However, the upper and lower ends of the silicon oxide member 38 are removed by wet etching and set back from the upper and lower surfaces of the silicon oxide film 14. As a result, a recess 38a is formed between the silicon nitride film 37 and the silicon oxide film 14.

Next, as shown in FIG. 3D, silicon is deposited through the slit 21. In general, when a material is deposited on a foundation, a time difference occurs from the time of starting the deposition to the time when the material is actually adhered to the foundation. This time difference is referred to as incubation time. The incubation time depends on the deposition condition and the material of the foundation. Thus, in the embodiment, by appropriately selecting the deposition condition of silicon, silicon is adhered to the silicon nitride film 37 before being adhered to the silicon oxide film 14. Thus, an amorphous silicon layer is formed on the silicon nitride film 37. When silicon starts to be adhered to the silicon oxide film 14, the deposition is stopped, and the deposited silicon is etched. Thus, deposition and etching of silicon are alternately repeated.

An example of the deposition condition and etching condition of silicon is as follows. In deposition, the deposition gas is disilane ($Si_2H_6$). The pressure is set to approximately 150 Pa (pascals). The temperature is set to approximately 400° C. In etching, the etching gas is a mixed gas of chlorine ($Cl_2$) and hydrogen ($H_2$) at a mixing ratio of 1:2. The pressure is set to approximately 60 Pa. The temperature is set to approximately 400° C.

Thus, an amorphous silicon layer is stacked only on the silicon nitride film 37. Subsequently, heat treatment is performed to crystallize the amorphous silicon layer. Thus, a floating electrode member 39 made of polysilicon is formed. The floating electrode member 39 is formed also in the recess 38a. The floating electrode member 39 is formed in a self-aligned manner in the region from which the silicon oxide member 38 has been removed. Thus, the silicon oxide members 38 and the floating electrode members 39 are alternately arranged along the Z-direction on the side surface of the silicon nitride film 37.

Next, as shown in FIG. 4A, silicon oxide ($SiO_2$) and aluminum oxide ($Al_2O_3$) are deposited in this order to form a block insulating film 40 made of a two-layer film of silicon oxide film and aluminum oxide film so as to cover the silicon oxide film 14 and the floating electrode member 39.

Next, as shown in FIG. 4B, a barrier metal layer 15a is formed on the side surface of the block insulating film 40 by depositing e.g. titanium nitride (TiN). Next, a seed layer (not shown) is formed by depositing tungsten (W).

Next, as shown in FIG. 4C, a tungsten film 15b is formed on the seed layer by depositing tungsten.

Next, as shown in FIG. 4D, etching is performed. Thus, while leaving the portion of the tungsten film 15b and the barrier metal layer 15a placed between the silicon oxide films 14 adjacent in the Z-direction, the other portion is removed. Thus, a gate electrode film 15 made of the barrier metal layer 15a and the tungsten film 15b is formed for each of the silicon oxide films 14 adjacent in the Z-direction. The gate electrode film 15 is divided in the Z-direction by the silicon oxide films 14.

Next, as shown in FIG. 1, an insulating member 22 is embedded in the slit 21. Next, an interlayer insulating film 17, a select gate electrode film 18, and an interlayer insulating film 19 are formed to form an upper stacked body 20. Next, a memory hole is formed in the upper stacked body 20. A gate insulating film 42, a silicon pillar 30, and a silicon oxide member 31 are formed on the inner surface of the memory hole. Next, a slit 21 is formed in the upper stacked body 20 to divide the select gate electrode film 18 into strip-shaped portions extending in the Y-direction. Next, an insulating member 22 is embedded in the slit 21. Next, a plug 43 and a bit line 45 embedded in the interlayer insulating film are formed on the upper stacked body 20. Thus, the semiconductor memory device 1 according to the embodiment is manufactured.

Next, the effect of the embodiment is described.

In the embodiment, in the step shown in FIG. 3A, silicon nitride films 51 and silicon oxide films 14 are alternately stacked to form a stacked body 16, and a slit 21 is formed. Then, in the step shown in FIG. 3B, the silicon nitride film 51 is removed through the slit 21. In the step shown in FIG. 3C, the silicon oxide film 14 is used as a mask to selectively remove the cover silicon oxide film 53. Then, in the step shown in FIG. 3D, a floating electrode member 39 is formed only on the exposed surface of the silicon nitride film 37 using the difference in incubation time.

Thus, in the semiconductor memory device 1 according to the embodiment, the floating electrode member 39 having higher conductivity than the silicon nitride film 37 can be provided as a charge accumulation member in addition to the silicon nitride film 37, which is insulative. That is, what is called the MONOS structure and the floating electrode structure can both be realized. As a result, the charge accumulation performance of the memory cell is improved, and the operation is stabilized. In particular, the erase operation can be performed by extracting electrons from the floating electrode member 39 rather than injecting holes into the floating electrode member 39. Thus, the temperature dependence is small, and the erase operation is stabilized.

Furthermore, in the embodiment, the floating electrode member 39 is divided along the Z-direction and placed for each gate electrode film 15. This can prevent electrons accumulated in the floating electrode member 39 of a memory cell from migrating to the floating electrode member 39 of the memory cell adjacent in the Z-direction. Thus, the semiconductor memory device 1 according to the embodiment is superior in data retention characteristics.

Furthermore, in the embodiment, in the step shown in FIG. 3C, the end surface of the silicon oxide member 38 is set back to form a recess 38a. Then, in the step shown in FIG. 3D, the floating electrode member 39 is formed also in the recess 38a. This can increase the volume of the floating electrode member 39 and enhance the charge accumulation performance. Furthermore, the effective gate width of the memory cell is widened, and the operation is further stabilized.

(First Variation of the First Embodiment)

Next, a first variation of the first embodiment is described.

The variations described below are examples in which the shape of the floating electrode member 39 is different from that of the first embodiment.

Figure 5:
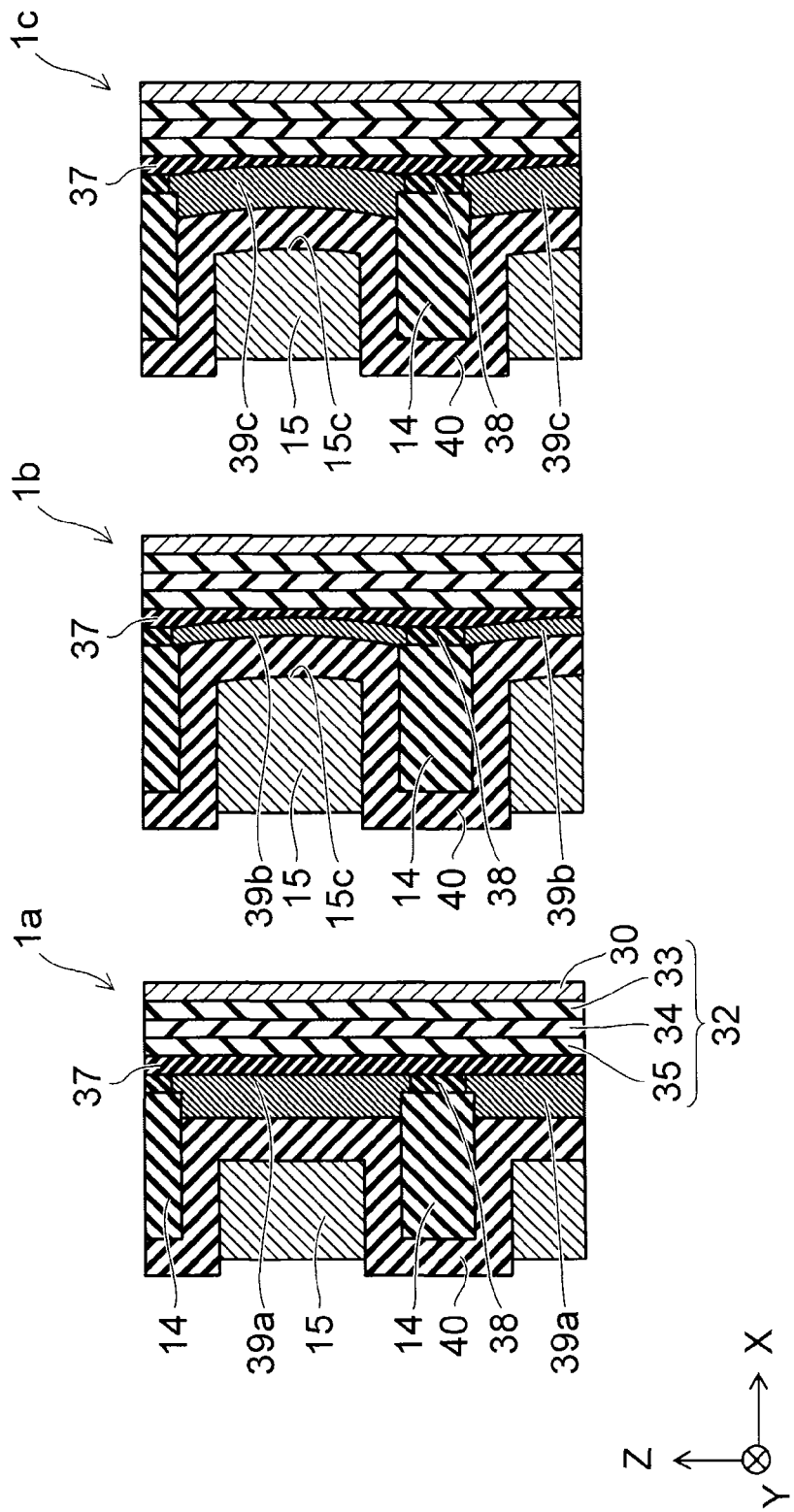
Figure 6:
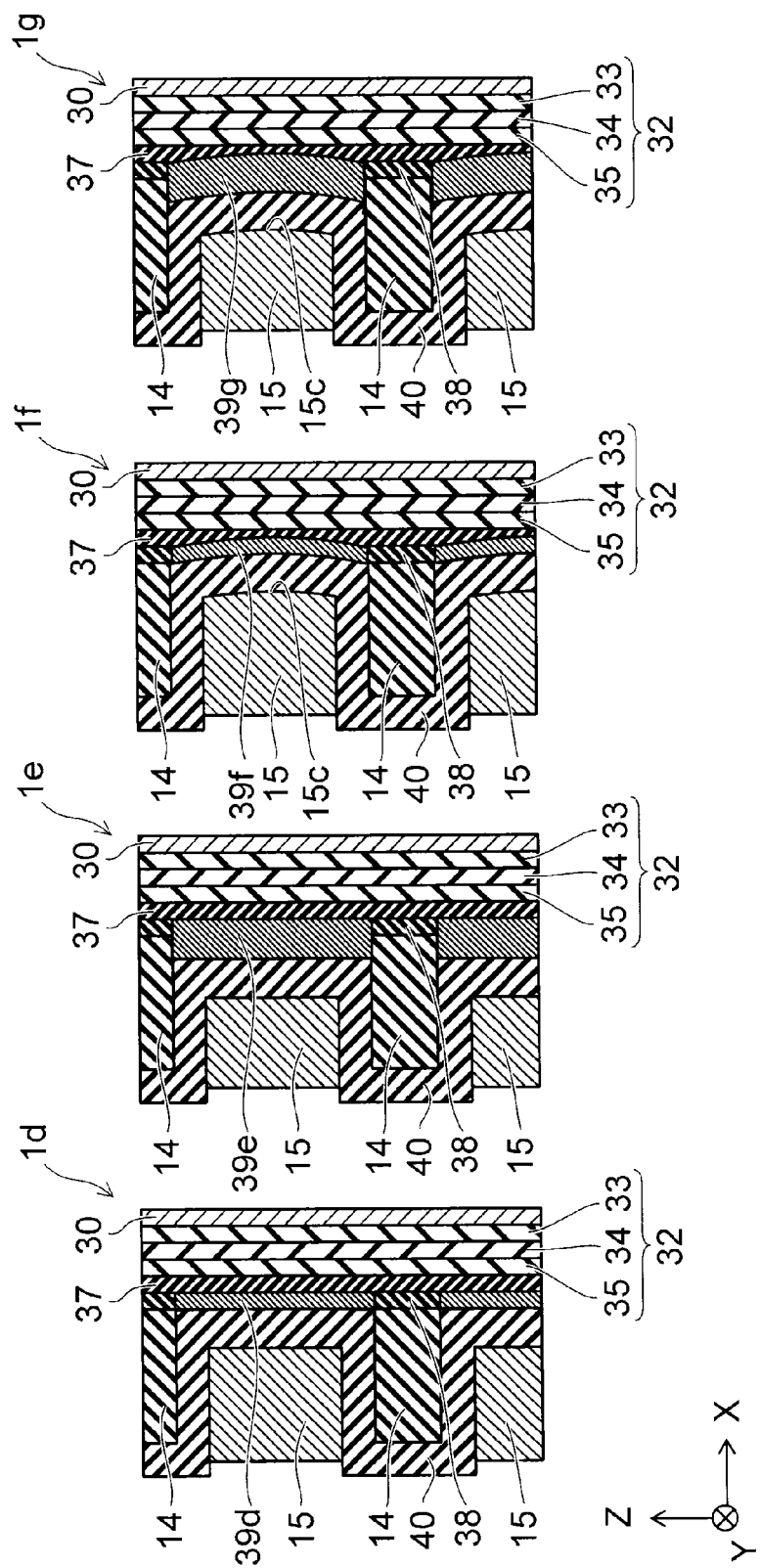

FIG. 5A is a sectional view showing the vicinity of the floating electrode member of a semiconductor memory device according to the variation. FIG. 5A shows a portion corresponding to region A of FIG. 1. This also applies to FIGS. 5B to 6D described later.

As shown in FIG. 5A, the semiconductor memory device 1a according to the variation is different from that of the first embodiment (see FIG. 2) in that the floating electrode member 39a is thicker than the silicon oxide member 38. Such a thick floating electrode member 39*a* can be formed by e.g. repeating the deposition and etching of silicon more times in the step shown in FIG. 3D.

The variation can enlarge the volume of the floating electrode member 39*a*. Thus, the charge accumulation performance is increased, and the operation of the memory cell is further stabilized.

The configuration, manufacturing method, and effect of the variation other than the foregoing are similar to those of the above first embodiment.

(Second Variation of the First Embodiment)

Next, a second variation of the first embodiment is described.

FIG. 5B is a sectional view showing the vicinity of the floating electrode member of a semiconductor memory device according to the variation.

As shown in FIG. 5B, in the semiconductor memory device 1*b* according to the variation, the portion of the silicon nitride film 37 opposed to the gate electrode film 15 is continuously thinned along the Z-direction and depressed concavely. Thus, the floating electrode member 39*b* is also curved reflecting the shape of the silicon nitride film 37. The side surface 15*c* of the gate electrode film 15 opposed to the floating electrode member 39*b* is also curved.

Such a configuration can be realized as follows. In the step shown in FIG. 3C, the etching selection ratio of silicon oxide relative to silicon nitride is slightly lowered. Thus, when the cover silicon oxide film 53 is etched, the silicon nitride film 37 is also etched to some extent.

According to the variation, the side surface 15*c* of the gate electrode film 15 opposed to the floating electrode member 39*b* is gradually curved and projected toward the floating electrode member 39*b*. Furthermore, the floating electrode member 39*b* and the silicon nitride film 37 are curved so as to enclose this projected portion. Thus, electric field concentration is prevented to suppress degradation of various parts. Furthermore, the operation of the memory cell can be stabilized.

The configuration, manufacturing method, and effect of the variation other than the foregoing are similar to those of the above first embodiment.

(Third Variation of the First Embodiment)

Next, a third variation of the first embodiment is described.

FIG. 5C is a sectional view showing the vicinity of the floating electrode member of a semiconductor memory device according to the variation.

As shown in FIG. 5C, the variation is a combination of the first variation and the second variation described above. That is, in the semiconductor memory device 1*c* according to the variation, the silicon nitride film 37 is depressed concavely. Reflecting this, the floating electrode member 39*c* and the side surface 15*c* of the gate electrode film 15 opposed to the floating electrode member 39*c* are also curved. Furthermore, the floating electrode member 39*c* is thicker than the silicon oxide member 38.

The configuration, manufacturing method, and effect of the variation other than the foregoing are similar to those of the above first and second variations.

(Fourth Variation of the First Embodiment)

Next, a fourth variation of the first embodiment is described.

FIG. 6A is a sectional view showing the vicinity of the floating electrode member of a semiconductor memory device according to the variation.

As shown in FIG. 6A, in the semiconductor memory device 1*d* according to the variation, the end surface of the silicon oxide member 38 is not set back from the upper and lower surface of the silicon oxide film 14. Thus, the recess 38*a* is not formed.

Such a configuration can be realized by e.g. making the film quality of the cover silicon oxide film 53 close to the film quality of the silicon oxide film 14 when the cover silicon oxide film 53 is formed in the step shown in FIG. 3A. Thus, in the step shown in FIG. 3C, the cover silicon oxide film 53 is etched to an extent comparable to the silicon oxide film 14.

The configuration, manufacturing method, and effect of the variation other than the foregoing are similar to those of the above first embodiment.

(Fifth Variation of the First Embodiment)

Next, a fifth variation of the first embodiment is described.

FIG. 6B is a sectional view showing the vicinity of the floating electrode member of a semiconductor memory device according to the variation.

As shown in FIG. 6B, the variation is a combination of the first variation and the fourth variation described above. That is, the floating electrode member 39*e* is thicker than the silicon oxide member 38, and the recess 38*a* is not formed.

The configuration, manufacturing method, and effect of the variation other than the foregoing are similar to those of the above first variation.

(Sixth Variation of the First Embodiment)

Next, a sixth variation of the first embodiment is described.

FIG. 6C is a sectional view showing the vicinity of the floating electrode member of a semiconductor memory device according to the variation.

As shown in FIG. 6C, the variation is a combination of the second variation and the fourth variation described above. That is, the side surface 15*c* of the gate electrode film 15 opposed to the floating electrode member 39*f* is curved convexly. The floating electrode member 39*f* is curved along the side surface 15*c* of the gate electrode film 15. Furthermore, the recess 38*a* is not formed.

The configuration, manufacturing method, and effect of the variation other than the foregoing are similar to those of the above second and fourth variations.

(Seventh Variation of the First Embodiment)

Next, a seventh variation of the first embodiment is described.

FIG. 6D is a sectional view showing the vicinity of the floating electrode member of a semiconductor memory device according to the variation.

As shown in FIG. 6D, the variation is a combination of the third variation and the fourth variation described above. That is, the side surface 15*c* of the gate electrode film 15 opposed to the floating electrode member 39*g* is curved convexly. The floating electrode member 39*g* is thicker than the silicon oxide member 38 and curved along the side surface 15*c* of the gate electrode film 15. Furthermore, the recess 38*a* is not formed.

The configuration, manufacturing method, and effect of the variation other than the foregoing are similar to those of the above fourth variation.

Second Embodiment

Next, a second embodiment is described.

Figure 7:
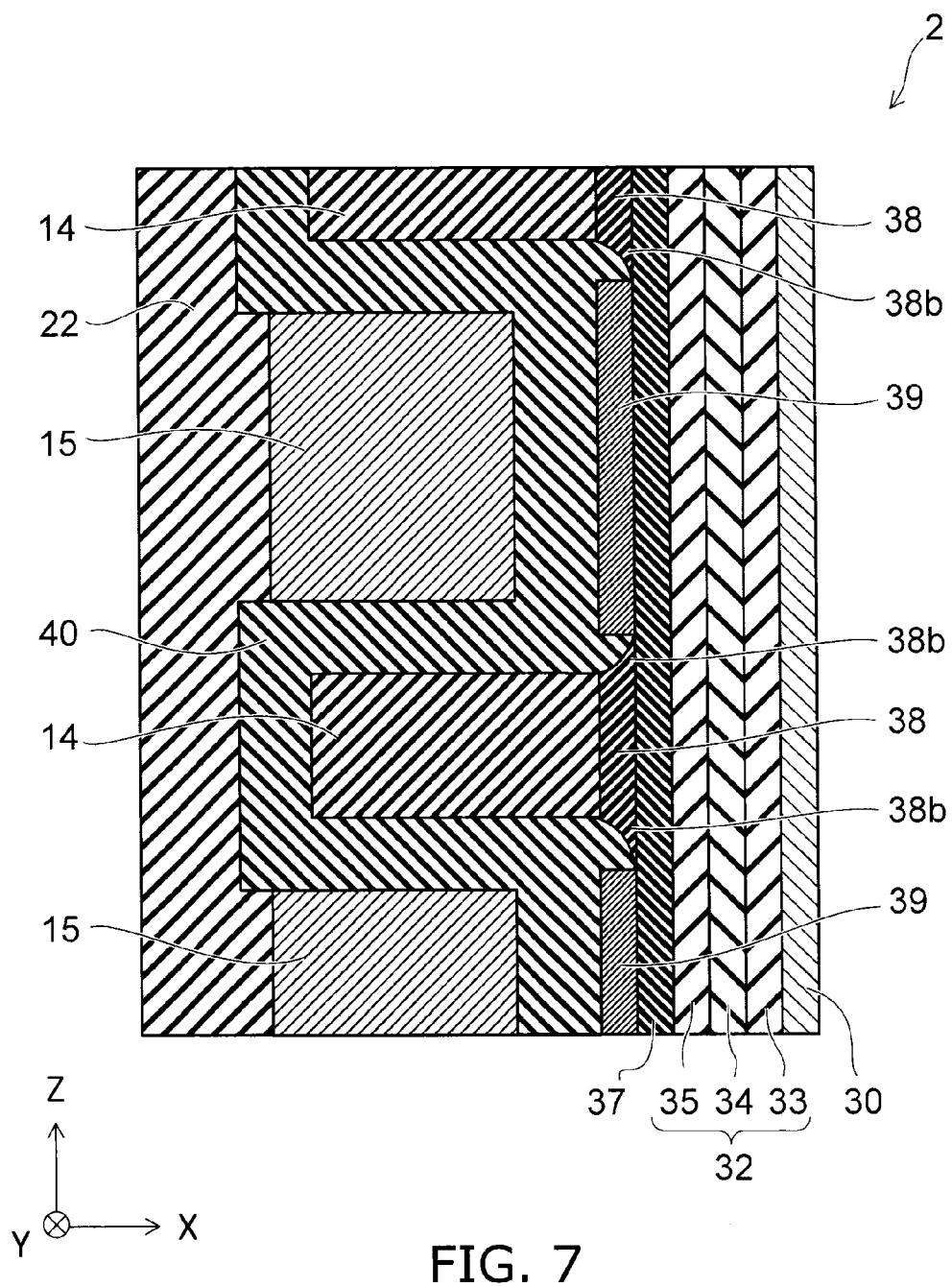
FIG. 7 is a sectional view showing a vicinity of a floating electrode member of a semiconductor memory device according to a second embodiment.

FIG. 7 is a sectional view showing the vicinity of the floating electrode member of a semiconductor memory device according to the embodiment. FIG. 7 shows a portion corresponding to region A of FIG. 1.

As shown in FIG. 7, in the semiconductor memory device 2 according to the embodiment, both end parts in the Z-direction of the silicon oxide member 38 extend out from the space between the silicon oxide film 14 and the silicon nitride film 37. This extending portion 38b has a tapered shape thinned toward the tip. That is, the recess 38a is not formed at the upper and lower ends of the silicon oxide member 38, but conversely, the silicon oxide member 38 is projected from the upper and lower surface of the silicon oxide film 14.

When the semiconductor memory device 2 according to the embodiment is manufactured, in the step shown in FIG. 3A, the cover silicon oxide film 53 is formed by thermal oxidation technique rather than deposition technique. Thus, in the step shown in FIG. 3C, the cover silicon oxide film 53 is not etched preferentially than the silicon oxide film 14. As a result, when the silicon nitride film 37 is exposed, an extending portion 38b having a tapered shape remains in the silicon oxide member 38.

The configuration, manufacturing method, operation, and effect of the embodiment other than the foregoing are similar to those of the above first embodiment.

(Variations of the Second Embodiment)

Next, variations of the second embodiment are described.

The variations described below are examples in which the shape of the floating electrode member 39 is different from that of the second embodiment.

FIGS. 8A to 11C are sectional views showing the vicinity of the floating electrode member of a semiconductor memory device according to the variations of the embodiment. FIGS. 8A to 11C show a portion corresponding to region A of FIG. 1.

FIG. 8A shows a variation in which the floating electrode member 39j is thicker than the silicon oxide member 38.

FIG. 8B shows a variation in which the floating electrode member 39k has a shape being relatively thick in the central part of the Z-direction and thinned toward the upper and lower end. The side surface 15c of the gate electrode film 15 opposed to the floating electrode member 39k is also curved along the shape of the floating electrode member 39k.

FIG. 8C shows a variation in which the floating electrode member 39l is thicker than that of the variation shown in FIG. 8B.

FIG. 8D shows a variation in which the floating electrode member 39m climbs on the end part 38b of the silicon oxide member 38 and has the same film thickness as the silicon oxide member 38.

Figures 9A, 9B, 9C, 9D:
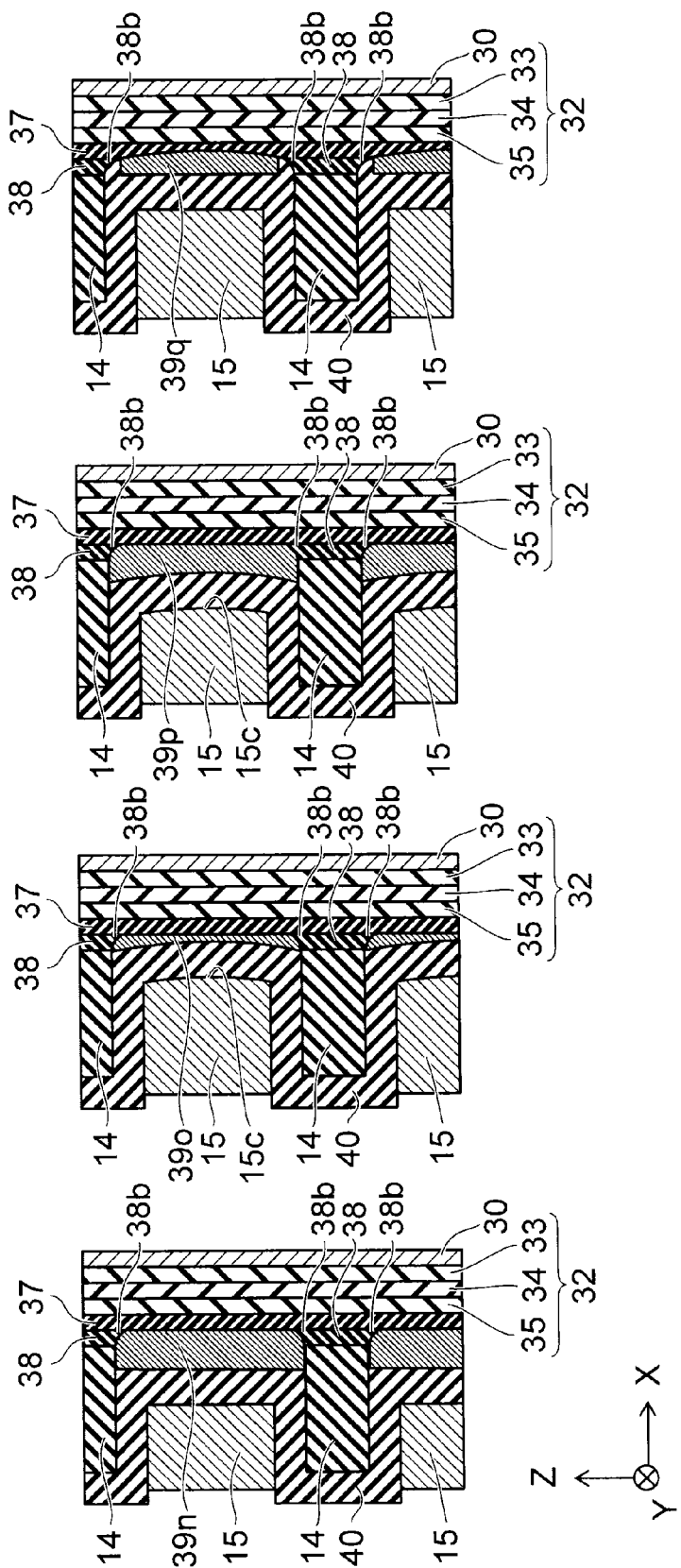

FIG. 9A shows a variation in which the floating electrode member 39n is thicker than that of the variation shown in FIG. 8D.

FIG. 9B shows a variation in which the floating electrode member 39o has a shape being relatively thin in the central part of the Z-direction and thickened toward the upper and lower end. The side surface 15c of the gate electrode film 15 opposed to the floating electrode member 39o is also curved along the shape of the floating electrode member 39o. Such a floating electrode member 39o can be formed by performing thermal oxidation treatment after growing a polysilicon film.

FIG. 9C shows a variation in which the floating electrode member 39p is thicker than that of the variation shown in FIG. 9B.

FIG. 9D shows a variation in which the portion of the silicon nitride film 37 opposed to the gate electrode film 15 is relatively thick in both end parts of the Z-direction and continuously thinned toward the central part of the Z-direction. Such a configuration is formed in the case where the silicon nitride film 37 is slightly etched and its surface is set back when the cover silicon oxide film 53 is removed by etching in the step shown in FIG. 3C.

FIG. 10A shows a variation in which the floating electrode member 39r is thicker than the silicon oxide member 38 compared with the variation shown in FIG. 9D.

FIG. 10B shows a variation in which both surfaces of the floating electrode member 39s are swollen convexly.

FIG. 10C shows a variation in which the floating electrode member 39t is thicker than that of the variation shown in FIG. 10B.

FIG. 10D shows a variation in which the upper and lower ends of the floating electrode member 39u climb on the tapered end part 38b of the silicon oxide member 38. Furthermore, the portion of the silicon nitride film 37 opposed to the gate electrode film 15 is relatively thick in both end parts of the Z-direction and continuously thinned toward the central part of the Z-direction.

Figures 11A, 11B, 11C:
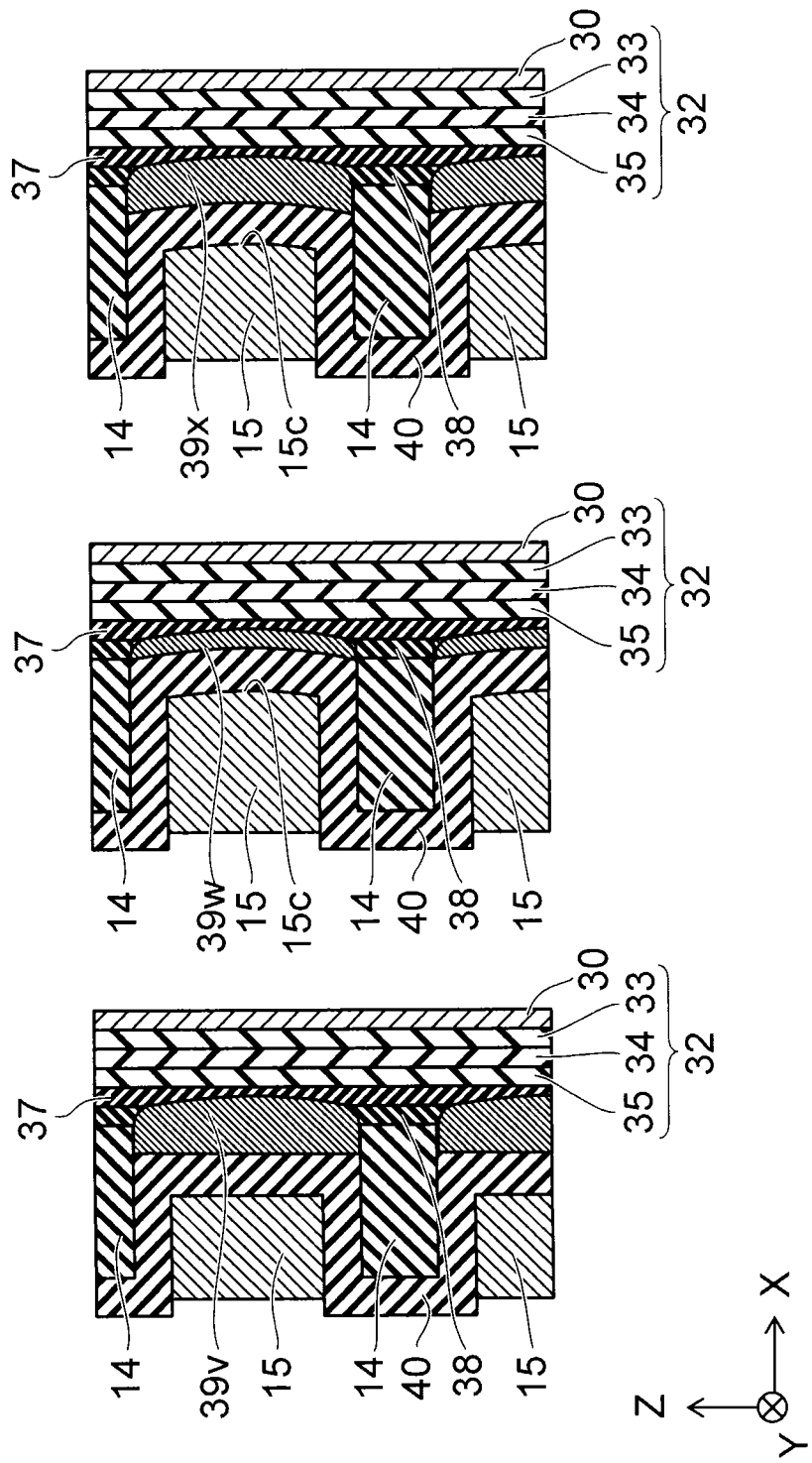

FIG. 11A shows a variation in which the floating electrode member 39v is thicker than that of the variation shown in FIG. 10D.

FIG. 11B shows a variation in which the portion of the silicon nitride film 37 opposed to the gate electrode film 15 is relatively thick in both end parts of the Z-direction and continuously thinned toward the central part of the Z-direction compared with the variation shown in FIG. 9B.

FIG. 11C shows a variation in which the floating electrode member 39x is thicker than that of the variation shown in FIG. 11B.

The configuration, manufacturing method, operation, and effect of these variations other than the foregoing are similar to those of the above second embodiment.

Third Embodiment

Next, a third embodiment is described.

Figure 12:
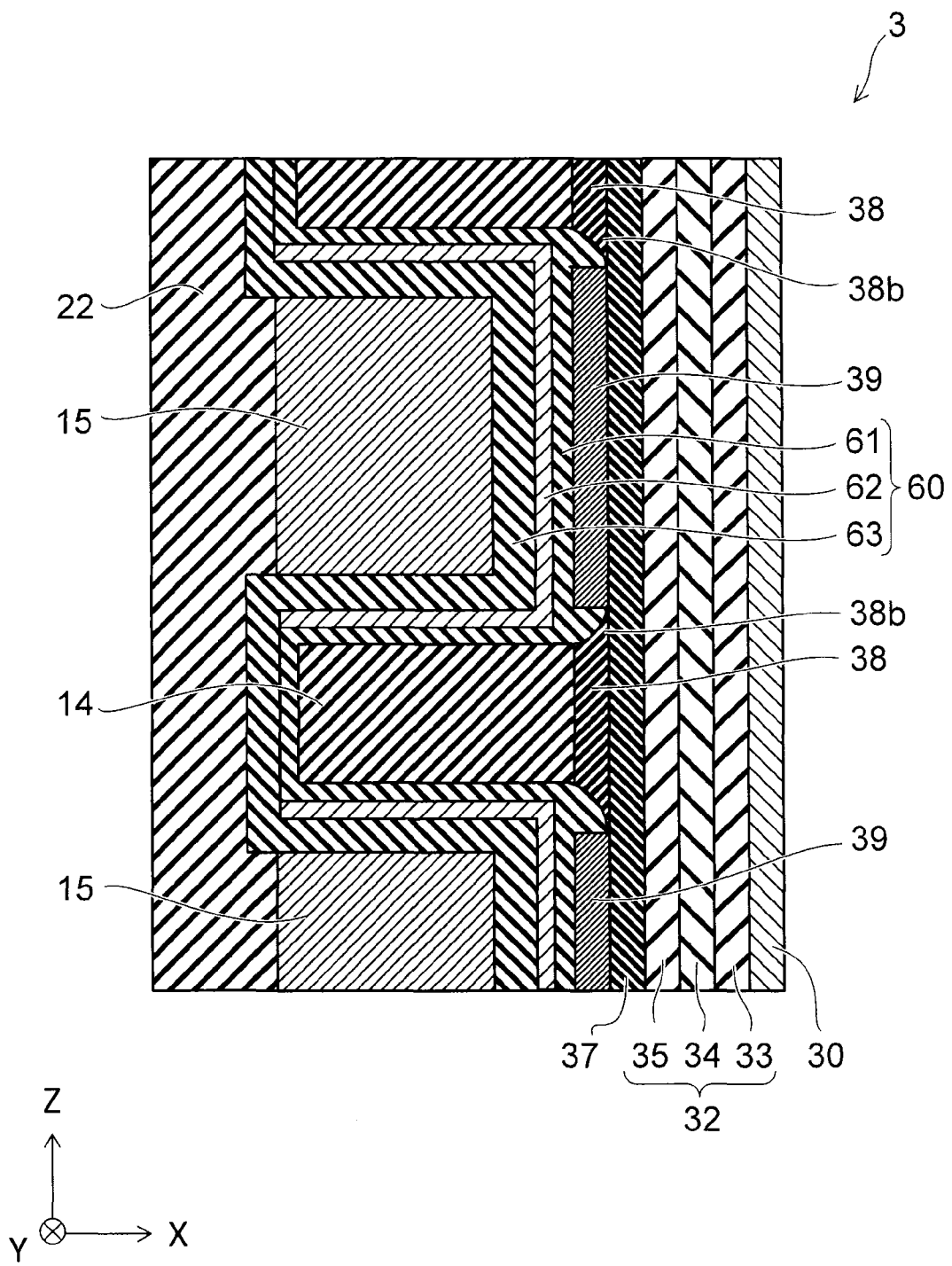
FIG. 12 is a sectional view showing a vicinity of a floating electrode member of a semiconductor memory device according to a third embodiment.

FIG. 12 is a sectional view showing the vicinity of the floating electrode member of a semiconductor memory device according to the embodiment. FIG. 12 shows a region corresponding to region A of FIG. 1.

As shown in FIG. 12, the semiconductor memory device 3 according to the embodiment is different from the semiconductor memory device 2 (see FIG. 7) according to the above second embodiment in the layer structure of the block insulating film.

More specifically, in the block insulating film 60 of the embodiment, a silicon nitride layer 61, a high work function layer 62, and a high dielectric layer 63 are stacked in this order from the silicon pillar 30 side toward the gate electrode film 15 side. The silicon nitride layer 61 is made of silicon nitride. The silicon nitride layer 61 is a barrier layer for suppressing oxidation, silicate formation, and diffusion of the high work function layer 62. The high work function layer 62 is not placed between the silicon oxide film 14 and the insulating member 22. In this region, the silicon nitride layer 61 is in contact with the high dielectric layer 63. Thus, the high work function layer 62 is divided for each gate electrode film 15 in the Z-direction.

The high work function layer 62 is made of a high work function material having high work function such as ruthenium (Ru), platinum (Pt), gold (Au), tungsten (W), and tantalum (Ta). The high work function layer 62 suppresses the leakage current flowing in the block insulating film 60. The high work function layer 62 is formed by e.g. CVD technique. If the high work function layer 62 is shaped like an accordion similar to the block insulating film 60, the charge accumulated in the floating electrode member 39 migrates to the adjacent memory cell through the high work function layer 62. Thus, after the high work function layer 62 is formed by CVD technique, the high work function layer 62 formed on the surface of the silicon oxide film 14 facing the slit 21 is removed by etching. This prevents electrical connection between the high work function layers 62 between the adjacent memory cells.

The high dielectric layer 63 is made of a high dielectric material and constitutes the main portion of the block insulating film 60. The high dielectric layer 63 may be formed from e.g. aluminum oxide or hafnium oxide, or may have a stacked structure of a hafnium oxide layer and a silicon oxide layer.

According to the embodiment, a high work function layer 62 is provided in the block insulating film 60. This can suppress more reliably the leakage current between the gate electrode film 15 on one hand and the floating electrode member 39 and the silicon nitride film 37 on the other.

The configuration, manufacturing method, operation, and effect of the embodiment other than the foregoing are similar to those of the above second embodiment.

(First Variation of the Third Embodiment)

Next, a first variation of the third embodiment is described.

Figure 13:
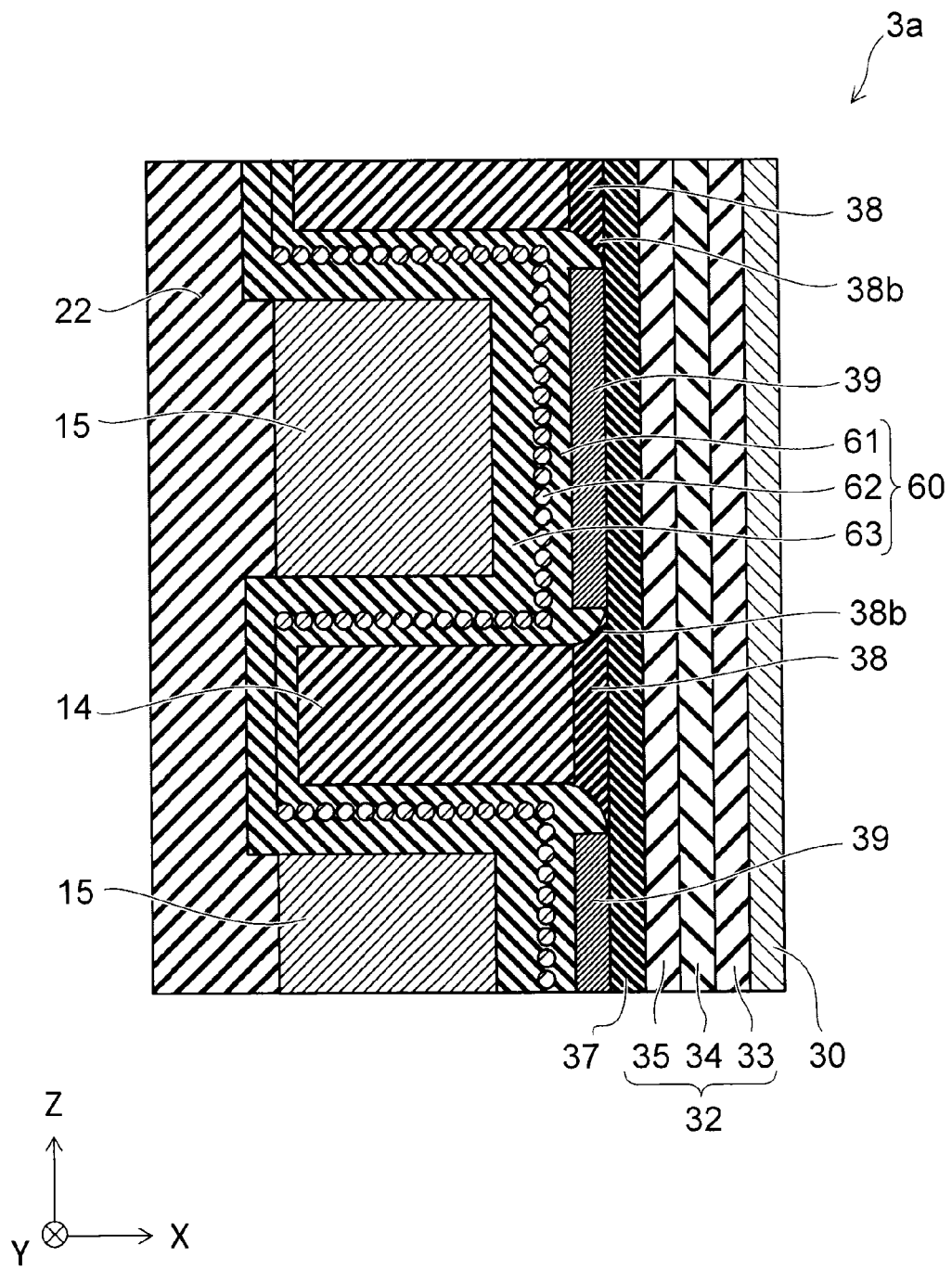
FIG. 13 is a sectional view showing a vicinity of a floating electrode member of a semiconductor memory device according to a first variation of the third embodiment.

FIG. 13 is a sectional view showing the vicinity of the floating electrode member of a semiconductor memory device according to the variation. FIG. 13 shows a region corresponding to region A of FIG. 1.

As shown in FIG. 13, in the semiconductor memory device 3a according to the variation, the high work function layer 62 is formed like dots rather than like a continuous film. This can also achieve an effect similar to that of the above third embodiment.

(Second Variation of the Third Embodiment)

Next, a second variation of the third embodiment is described.

Figure 14:
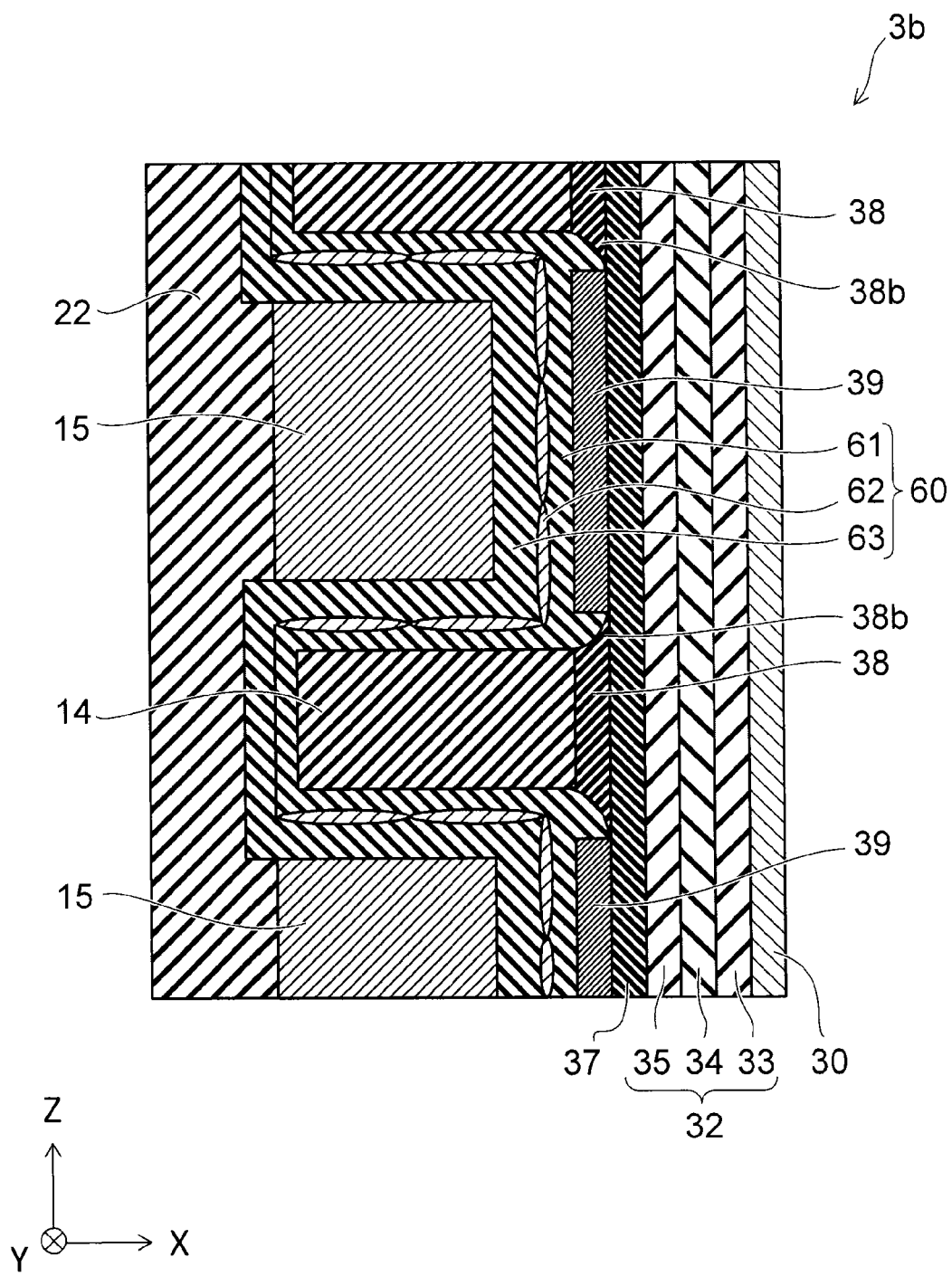
FIG. 14 is a sectional view showing a vicinity of a floating electrode member of a semiconductor memory device according to a second variation of the third embodiment.

FIG. 14 is a sectional view showing the vicinity of the floating electrode member of a semiconductor memory device according to the variation. FIG. 14 shows a region corresponding to region A of FIG. 1.

As shown in FIG. 14, in the semiconductor memory device 3b according to the variation, the high work function layer 62 is formed like islands. This can also achieve an effect similar to that of the above third embodiment.

Fourth Embodiment

Next, a fourth embodiment is described.

Figure 15:
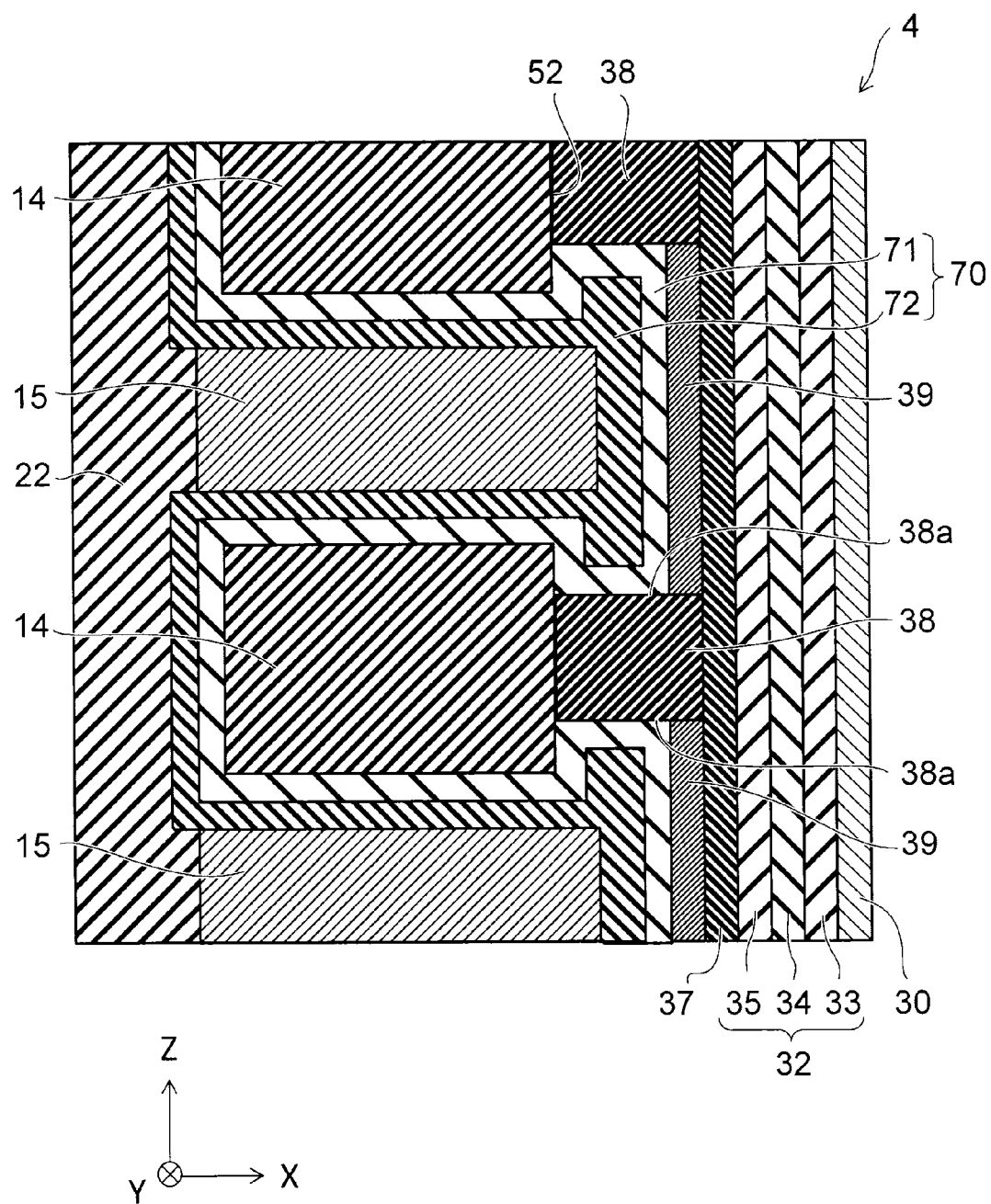
FIG. 15 is a sectional view showing a vicinity of a floating electrode member of a semiconductor memory device according to a fourth embodiment.

FIG. 15 is a sectional view showing the vicinity of the floating electrode member of a semiconductor memory device according to the embodiment. FIG. 15 shows a region corresponding to region A of FIG. 1.

As shown in FIG. 15, the semiconductor memory device 4 according to the embodiment is different from the semiconductor memory device 1 (see FIG. 2) according to the above first embodiment in that the insulating member 38 is thicker and that part of the block insulating film 70 is placed between the silicon nitride film 37 and the silicon oxide film 14. That is, the block insulating film 70 is placed not only between the silicon nitride film 37 and the gate electrode film 15, but also between the silicon nitride film 37 and the silicon oxide film 14.

More specifically, part of the block insulating film 70 is inserted into the recess 38a formed by the set-back of the end surface of the insulating member 38. The block insulating film 70 is e.g. a two-layer film made of a silicon oxide layer 71 placed on the silicon pillar 30 side and a high dielectric layer 72 placed on the gate electrode film 15 side. The high dielectric layer 72 is formed from e.g. aluminum oxide or hafnium oxide. The silicon oxide layer 71 is formed like a layer on the inner surface of the recess 38a. The high dielectric layer 72 fills the recess 38a.

Next, a method for manufacturing a semiconductor memory device according to the embodiment is described.

FIGS. 16A to 16D are process sectional views showing the method for manufacturing a semiconductor memory device according to the embodiment. FIGS. 16A to 16D show a portion corresponding to region A of FIG. 1.

Figure 16:
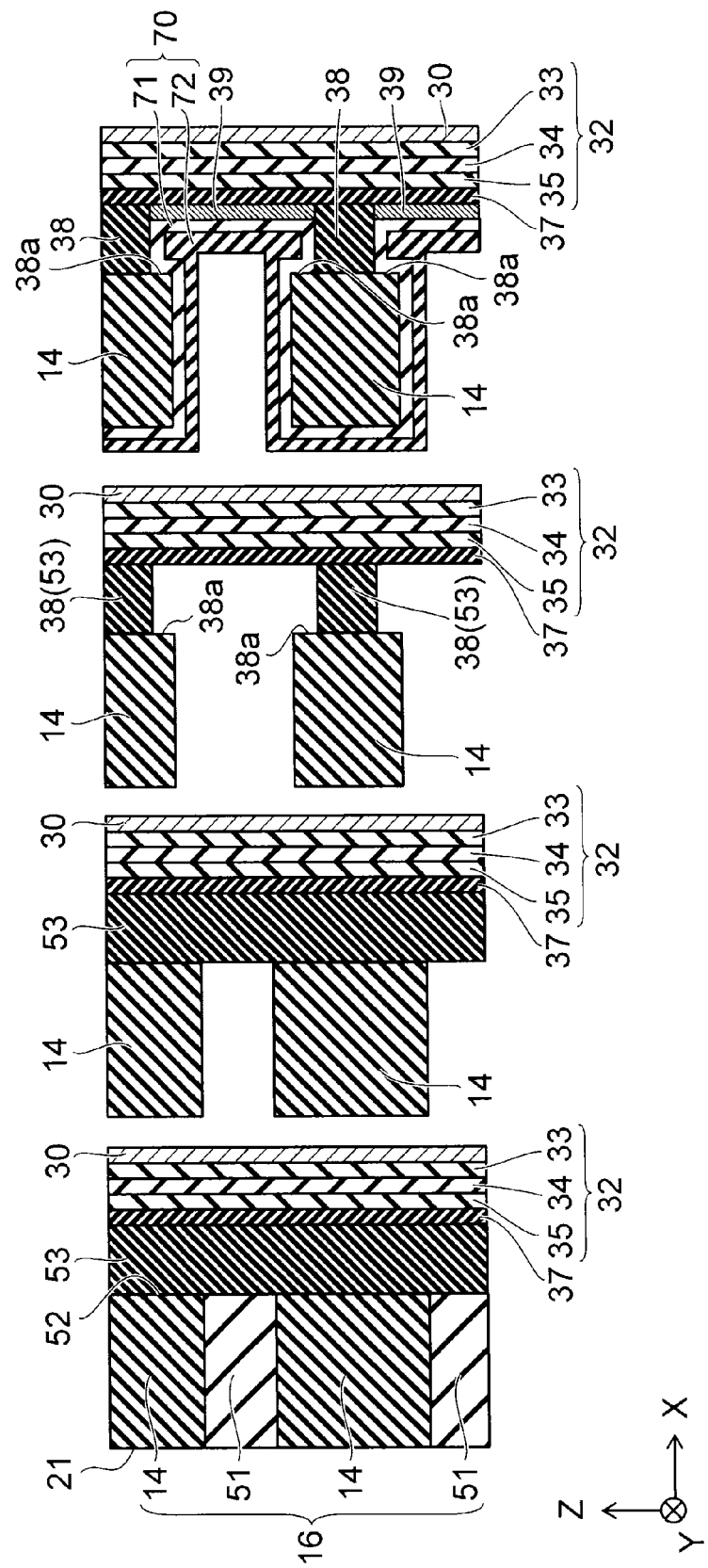
FIGS. 16A to 16D are process sectional views showing a method for manufacturing a semiconductor memory device according to the fourth embodiment.

As shown in FIG. 16A, a stacked body 16 made of silicon oxide films 14 and silicon nitride films 51 is formed by a method similar to that of the above first embodiment. Then, a memory hole 52 is formed in the stacked body 16. A cover silicon oxide film 53 and a silicon nitride film 37 are formed on the inner surface of the memory hole 52. At this time, the cover silicon oxide film 53 is formed thicker than in the above first embodiment.

Next, a silicon oxide layer 35, a silicon nitride layer 34, and a silicon oxide layer 33 are formed in this order to form a tunnel insulating film 32 on the side surface of the silicon nitride film 37. A silicon pillar 30 is formed on the side surface of the tunnel insulating film 32. Next, a silicon oxide member 31 is embedded inside the silicon pillar 30. Next, a slit 21 is formed in the stacked body 16.

Next, as shown in FIG. 16B, the silicon nitride film 51 is removed by wet etching through the slit 21.

Next, as shown in FIG. 16C, the cover silicon oxide film 53 is selectively removed by wet etching through the slit 21. Thus, the remaining portion of the cover silicon oxide film 53 constitutes a silicon oxide member 38. At this time, the upper and lower end surfaces of the silicon oxide member 38 are set back from the upper and lower surfaces of the silicon oxide film 14. Thus, a recess 38a is formed. In the embodiment, the cover silicon oxide film 53 is formed thickly in advance. Thus, the thickness of the silicon oxide member 38 and the width of the recess 38a in the Z-direction are wider than those of the first embodiment.

Next, as shown in FIG. 16D, as in the above first embodiment, a floating electrode member 39 made of polysilicon is formed only on the silicon nitride film 37 using the difference in incubation time. At this time, the thickness of the floating electrode member 39 is made comparable to that of the first embodiment. The floating electrode member 39 is formed also in the recess 38a. However, the width of the recess 38a is wider than that of the first embodiment. Thus, the floating electrode member 39 does not completely fill the recess 38a.

Next, silicon oxide is deposited on the entire surface to form a silicon oxide layer 71. The silicon oxide layer 71 is formed on the exposes surface of the silicon oxide film 14 and on the side surface of the floating electrode member 39. Furthermore, the silicon oxide layer 71 is formed also on the inner surface of the recess 38a. Next, aluminum oxide or hafnium oxide is deposited to form a high dielectric layer 72 on the side surface of the silicon oxide layer 71. The high dielectric layer 72 is embedded in the recess 38a. Thus, a block insulating film 70 is formed. The subsequent manufacturing method is similar to that of the above first embodiment.

Next, the effect of the embodiment is described.

In the embodiment, in the step shown in FIG. 16A, the cover silicon oxide film 53 is formed thickly. In the step shown in FIG. 16D, part of the block insulating film 70 is embedded in the recess 38a. Thus, the minimum inner diameter of the block insulating film 70 formed like an accordion can be made smaller than the inner diameter of the memory hole 52. As a result, when the memory hole 52 is finely formed close to the limit of lithography technique, the memory cell can be miniaturized beyond the limit of lithography technique.

Furthermore, according to the embodiment, part of the block insulating film 70 is placed in the recess 38a. Thus, the high dielectric layer 72 can be interposed in a large amount between the gate electrode film 15 belonging to a memory cell and the silicon pillar 30 belonging to the adjacent memory cell. This can reduce the influence exerted by the operation of a memory cell on the adjacent memory cell.

The configuration, manufacturing method, operation, and effect of the embodiment other than the foregoing are similar to those of the above first embodiment.

Fifth Embodiment

Next, a fifth embodiment is described.

Figure 17:
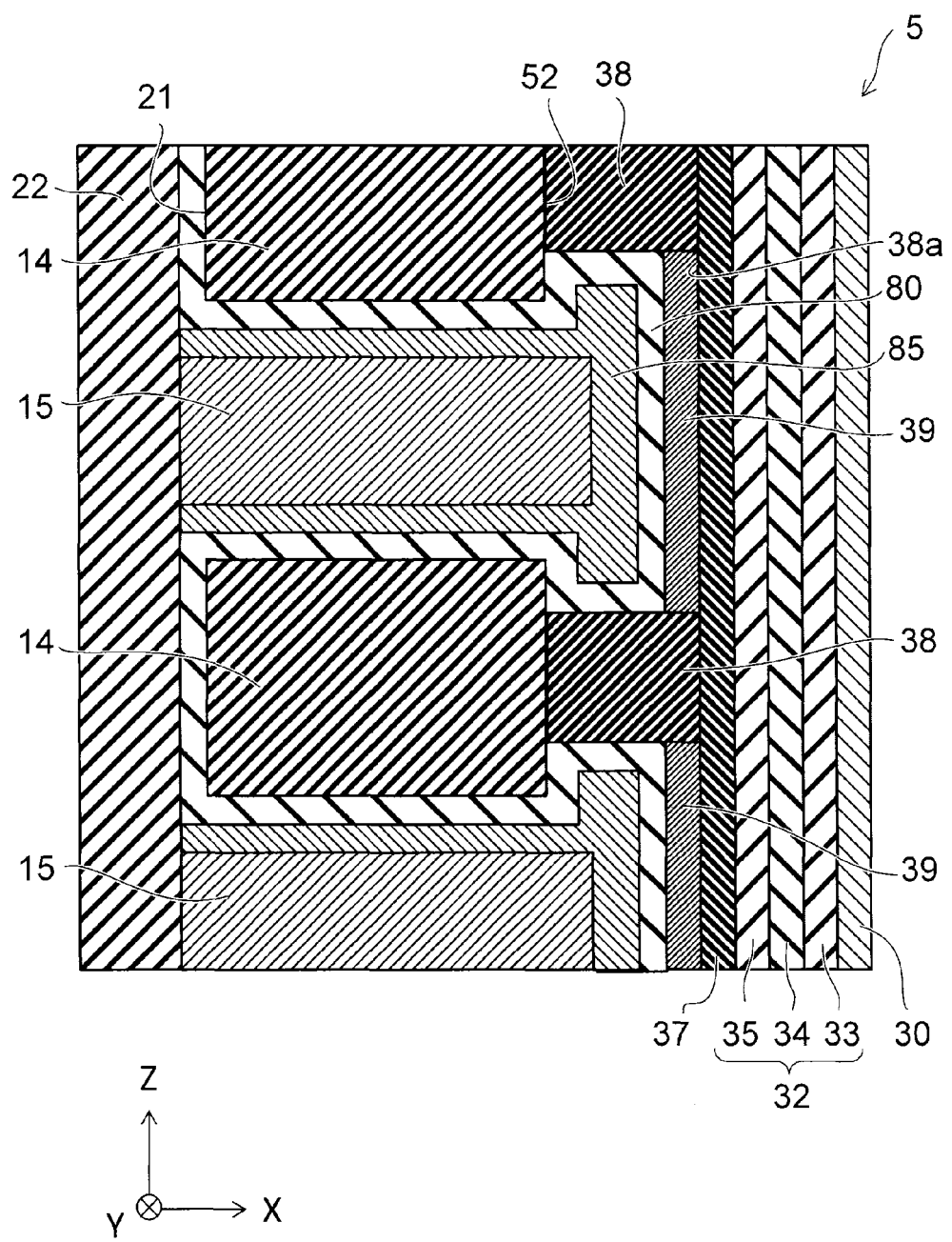
FIG. 17 is a sectional view showing a vicinity of a floating electrode member of a semiconductor memory device according to a fifth embodiment.

FIG. 17 is a sectional view showing the vicinity of the floating electrode member of a semiconductor memory device according to the embodiment. FIG. 17 shows a region corresponding to region A of FIG. 1.

As shown in FIG. 17, the semiconductor memory device 5 according to the embodiment is different from the semiconductor memory device 4 (see FIG. 15) according to the above fourth embodiment in that a block insulating film 80 is provided instead of the silicon oxide layer 71 (see FIG. 15), and that a metal layer 85 is provided instead of the high dielectric layer 72 (see FIG. 15). However, the metal layer 85 is not placed between the silicon oxide film 14 and the insulating member 22. In this region, the block insulating film 80 is in contact with the insulating member 22. Thus, the metal layer 85 is divided for each gate electrode film 15 in the Z-direction.

The block insulating film 80 is e.g. a stacked film of a silicon oxide layer and an aluminum oxide layer. The metal layer 85 is formed from e.g. tungsten. The metal layer 85 is connected to the gate electrode film 15 and functions as part of the gate electrode. The semiconductor memory device 5 according to the embodiment is manufactured by forming a block insulating film 80 instead of the silicon oxide layer 71 and forming a metal layer 85 instead of the high dielectric layer 72 in the step shown in FIG. 16D. However, if the metal layer 85 is shaped like an accordion similar to the block insulating film 80, the gate electrode films 15 are short-circuited between the memory cells adjacent in the Z-direction. Thus, after the metal layer 85 is formed by CVD technique, the metal layer 85 is selectively removed by etching so that the metal layers 85 are not connected between the memory cells adjacent in the Z-direction.

Next, the effect of the embodiment is described.

According to the embodiment, the metal layer 85 can be used as an extending portion of the gate electrode film 15. Thus, the effective gate width can be widened. This can increase the on-current of the memory cell.

The configuration, manufacturing method, operation, and effect of the embodiment other than the foregoing are similar to those of the above fourth embodiment.

In the examples described in the above embodiments, a floating electrode member 39 made of polysilicon is formed on the silicon nitride film 37 using the difference in incubation time. However, the invention is not limited thereto. For instance, in the step shown in FIG. 3C, after the silicon nitride film 37 is exposed, the exposed portion of the silicon nitride film 37 may be changed to a floating electrode member 39 having higher conductivity by annealing in a hydrogen atmosphere.

In the examples described in the above embodiments, the semiconductor memory device is what is called an I-shaped device in which the lower end of the silicon pillar 30 is connected to the source electrode film 12. However, the device is not limited to the I-shaped device. For instance, the device may be what is called a U-shaped device in which the lower end parts of the two adjacent silicon pillars are connected to each other, the upper end part of one silicon pillar is connected to a bit line, and the upper end part of the other silicon pillar is connected to a source line.

Furthermore, in the configuration described in the above embodiments, an interlayer insulating film 11 and a source electrode film 12 are placed on a silicon substrate 10, and the silicon pillar 30 is connected to the source electrode film 12. However, the invention is not limited to this configuration. For instance, as an alternative configuration, the silicon pillar 30 may be directly connected to the silicon substrate 10 without placing the interlayer insulating film 11.

The embodiments described above can realize a semiconductor memory device having high data retention characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
    a stacked body with electrode films and inter-electrode insulating films alternately stacked therein;
    a semiconductor member provided in the stacked body and extending in stacking direction of the electrode films and the inter-electrode insulating films;
    a first insulating film provided on a side surface of the semiconductor member;
    a charge accumulation film provided on a side surface of the first insulating film;
    an insulating member provided at a position opposed to the inter-electrode insulating film on a side surface of the charge accumulation film, divided for each of the inter-electrode insulating films along the stacking direction, and made of a material different from that of the charge accumulation film;
    a floating electrode member provided on a region of the side surface of the charge accumulation film not covered with the insulating member, being in contact with the charge accumulation film, divided for each of the electrode films along the stacking direction, and having higher conductivity than the charge accumulation film; and
    a second insulating film provided between the floating electrode member and the electrode film.

2. The device according to claim 1, wherein
    the inter-electrode insulating film and the insulating member include silicon oxide, and
    the charge accumulation film includes silicon nitride.

3. The device according to claim 1, wherein the floating electrode member includes one or more materials selected from the group consisting of metal, metal oxide, and metal nitride.

4. The device according to claim 1, wherein the floating electrode member includes one or more materials selected from the group consisting of silicon, tungsten, ruthenium, platinum, tantalum, tantalum oxide, ruthenium oxide, tantalum nitride, tungsten nitride, and silicon nitride.

5. The device according to claim 1, wherein part of the second insulating film includes a high work function material.

6. The device according to claim 5, wherein the high work function material includes one or more materials selected from the group consisting of ruthenium, platinum, gold, tungsten, and tantalum.

7. The device according to claim 1, wherein an end part of the insulating member in the stacking direction extends out from a space between the inter-electrode insulating film and the charge accumulation film.

8. The device according to claim 7, wherein the extending portion has a tapered shape thinned toward the end part.

9. The device according to claim 1, wherein length of the insulating member is shorter than length of the inter-electrode insulating film in the stacking direction.

10. The device according to claim 1, wherein thickness of the floating electrode member is thicker than thickness of the insulating member in a direction orthogonal to the stacking direction.

11. The device according to claim 1, wherein thickness of the floating electrode member is thinner than thickness of the insulating member in a direction orthogonal to the stacking direction.

12. The device according to claim 1, wherein part of the second insulating film is placed between the charge accumulation film and the inter-electrode insulating film in a direction orthogonal to the stacking direction.

13. The device according to claim 12, wherein part of the electrode film is placed between the charge accumulation film and the inter-electrode insulating film in a direction orthogonal to the stacking direction.

14. A semiconductor memory device comprising:
a stacked body with electrode films and inter-electrode insulating films alternately stacked therein;
a semiconductor member provided in the stacked body and extending in stacking direction of the electrode films and the inter-electrode insulating films;
a first insulating film provided on a side surface of the semiconductor member;
a charge accumulation film provided on a side surface of the first insulating film;
an insulating member provided at a position opposed to the inter-electrode insulating film on a side surface of the charge accumulation film and divided for each of the inter-electrode insulating films along the stacking direction, length of the insulating member in the stacking direction being shorter than length of the inter-electrode insulating film in the stacking direction; and
a second insulating film provided between the charge accumulation film and the electrode film and between the charge accumulation film and the inter-electrode insulating film.

15. The device according to claim 14, wherein part of the electrode film is placed between the charge accumulation film and the inter-electrode insulating film.

16. The device according to claim 14, wherein the second insulating film includes aluminum oxide or hafnium oxide.

17. The device according to claim 14, further comprising:
a floating electrode member provided on a region of the side surface of the charge accumulation film not covered with the insulating member, being in contact with the charge accumulation film, divided for each of the electrode films along the stacking direction, and having higher conductivity than the charge accumulation film.

* * * * *